(12) United States Patent
Sato et al.

(10) Patent No.: US 7,157,738 B2
(45) Date of Patent: Jan. 2, 2007

(54) CAPACITOR ELEMENT AND ITS MANUFACTURING METHOD

(75) Inventors: Susumu Sato, Kanagawa (JP); Hiroshi Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 332 days.

(21) Appl. No.: 10/169,413

(22) PCT Filed: Nov. 1, 2001

(86) PCT No.: PCT/JP01/09595

§ 371 (c)(1),
(2), (4) Date: Oct. 3, 2002

(87) PCT Pub. No.: WO02/37567

PCT Pub. Date: May 10, 2002

(65) Prior Publication Data

US 2004/0222493 A1    Nov. 11, 2004

(30) Foreign Application Priority Data

Nov. 1, 2000   (JP) ............................. 2000-334892
Aug. 8, 2001   (JP) ............................. 2001-241274

(51) Int. Cl.
*H01L 29/76* (2006.01)
(52) U.S. Cl. .......................................... 257/71; 257/68
(58) Field of Classification Search .................. 257/68, 257/71
See application file for complete search history.

(56) References Cited

U.S. PATENT DOCUMENTS 5,736,421 A    4/1998   Shimomura et al. ......... 427/224
6,037,264 A *  3/2000   Hwang ........................ 438/714
6,090,697 A *  7/2000   Xing et al. ................... 438/618
6,335,241 B1 * 1/2002   Hieda et al. ................. 438/253
2002/0153552 A1* 10/2002  Hieda et al. ................. 257/306
2002/0189933 A1* 12/2002  Nakamura ............. 204/192.18

FOREIGN PATENT DOCUMENTS

| JP | 02-001154 | 1/1990 |
|----|-----------|--------|
| JP | 02-046756 | 2/1990 |
| JP | 02-060157 | 2/1990 |
| JP | 05-003300 | 1/1993 |
| JP | 06-013543 | 1/1994 |
| JP | 06-204430 | 7/1994 |
| JP | 07-235616 | 9/1995 |
| JP | 2000-208440 | 7/2000 |

* cited by examiner

*Primary Examiner*—Thomas L. Dickey
(74) *Attorney, Agent, or Firm*—Sonnenschein Nath & Rosenthal LLP

(57) ABSTRACT

The present invention relates to a capacitor element and its manufacturing method. The invention presents a capacitor element comprising a lower electrode, a dielectric film, and an upper electrode, and its manufacturing method, in which the surface of at least one layer of the lower electrode in a single layer structure or laminated structure, for example, the surface of the lower electrode contacting with the dielectric film, is flattened by processing the material itself which composes this surface. For example, it is flattened by filling the recesses at the crystal grain boundary of the surface with the material itself shaved from the surface. As a result, undulations of the surface of the lower electrode of the capacitor element are lessened, and the film thickness of the dielectric film is made uniform, and capacity drop and increase of leak current can be prevented.

3 Claims, 22 Drawing Sheets

CAPACITOR ELEMENT AND ITS MANUFACTURING METHOD

TECHNICAL FIELD

The present invention relates to a capacitor element used in a semiconductor device or the like, and a method of manufacturing the same, and more particularly to an MIM (Metal Insulator Metal) type capacitor element composed of a film of high dielectric constant, and its manufacturing method in general.

More specifically, the invention mainly relates to a technical field of Bi-CMOS semiconductor integrated device having an analog-digital circuit function composed of bipolar transistors and others requiring mounting of a dielectric capacitor element having excellent electric characteristics in dielectric strength and a leak current, and also having a high precision, or a semiconductor integrated device requiring mounting of a memory cell such as DRAM.

Part of the technology of the invention includes a technical region relating to a semiconductor device structure such as high frequency circuit integrated device having circuits formed in a GaAs substrate or the like, and its manufacturing method.

BACKGROUND OF THE INVENTION

The progress of electronic devices represented by semiconductor devices is dramatic, the requirements for constituent components and elements are becoming more and more advanced. In this background, capacitor elements functioning as passive elements are intensively studied to have higher degree of integration and larger capacity.

In the technology for enhancing the degree of integration and capacity of capacitor elements, instead of the hitherto used dielectric film materials such as $Si_3N_4$ or plasma SiN, it is proposed to use materials of high dielectric constant, such as $Ta_2O_5$ (Tantalum Pentoxide) and other transition metal oxides. The configuration of the capacitor element has been changed from the MIS (Metal Insulator Silicon) capacitor to the MIM (Metal Insulator Metal) capacitor.

The lower electrode and upper electrode of the MIM type capacitor are formed by sputtering method, vapor deposition method, MOCVD method, etc. Dielectric films of materials of high dielectric constant represented by transition metal oxides are formed by (1) low pressure heat CVD (Chemical vapor Deposition) method, (2) sputtering method or vapor deposition method, and (3) plasma CVD method, etc.

These forming methods of dielectric films differ depending on the performance and uses of capacitor elements, and the lower electrode material (Metal Material) and its forming method may be selected as follows depending on the forming method of the dielectric film.

(1) In the case of a dielectric film formed by low pressure heat CVD method, when the dielectric film and the lower electrode layer contact with each other at high temperature, a problem of deterioration (Oxygen Deficiency, etc.) of the quality of the dielectric film may occur at the interface due to reactive oxygen gas when forming the dielectric film or reaction between the oxygen contained in the dielectric film and the lower electrode layer. To avoid this problem, as a barrier layer between the lower electrode layer and dielectric film, it is attempted to laminate a metal of high boiling point of nitride or oxide relatively hard to react, such as TiN, TiO, WN, WO, TaN, and TaO.

Recently, at the interface contacting with the dielectric film when forming the dielectric film, a platinum group metal (Ru, Rh, Pd, Os, Ir) not forming oxide, represented by Au, Ag, and Pt (platinum), is used as the lower electrode.

Or if oxides are slightly formed, such oxides are used as a conductive material, and an oxide material of platinum group metal (Ru, Rh, Pd, Os, Ir) represented by Pt (platinum) is used as a barrier layer between the lower electrode layer and dielectric film. The barrier layer may be used as part of the electrode layer.

(2) In the case of the dielectric film formed by sputtering method or vapor deposition method, satisfactory film is not obtained, and high temperature heat treatment by RTO (rapid thermal oxidation) is needed after forming the film, and hence the material of the lower electrode mentioned above is used.

(3) In the case of the dielectric film formed by plasma CVD method, the film can be formed at low temperature and a film of a relatively favorable quality is obtained, and high temperature heat treatment is not necessary, and reaction hardly occurs at the interface contacting with the dielectric film when forming the dielectric film.

Hence, as the lower electrode material, low melting point metal materials are used such as AlSi, AlSiCu, and AlCu, or as the barrier layer between the lower electrode layer and dielectric film, a high melting point metal material is laminated on the low melting point metal material.

By such combination of lower electrode material and dielectric film material, it is possible to form a dielectric film of high quality not forming reaction layer at the interface contacting with the lower electrode and dielectric film.

However, there is a common problem regardless of the manufacturing methods of MIM type capacitor elements. When the metal material used in the lower electrode or upper electrode of the MIM type capacitor element used in a semiconductor device is formed by sputtering method, vapor deposition method, or MOCVD method, the obtained film is generally composed of a polycrystalline structure. The surface is considerably undulated. That is, there are recesses and bumps represented by crystal grains or hillocks at the interface contacting with the lower electrode layer and dielectric film.

Depending on the metal materials, the shape and size of surface undulations (Crystal Shapes) are different. This is explained as follows.

Supposing the melting point to be Tm (°C.), recrystallization temperature to be Tr (up to ⅓ Tm), and surface self-diffusion temperature to be Tsd (up to ¹/₁₀ Tm), the relations between the film structure and substrate temperature T when forming the lower electrode shows the following tendency.

$$Tm>T>Tr \quad (1)$$

Since T is the recrystallization temperature Tr or more, crystal grains grow to form large crystal grains like a stone hedge.

$$Tr>T>Tsd \quad (2)$$

Since T is the recrystallization temperature Tr or less, growth of crystal grains is suppressed, but since it is the surface diffusion temperature Tsd or more, the film is formed in crystals long in the vertical direction, that is, columnar crystal grains.

$$T<Tsd \quad (3)$$

Since T is lower than the surface diffusion temperature Tsd, growth of crystal grain boundary is insufficient, and the film is acicular.

For example, in the high melting point material of TiN, the recrystallization temperature is about 1000° C., and when a film is formed at substrate temperature of about 300 to 500° C., every crystal grain is formed like a fine columnar crystal grain shape, and rugged undulations are formed on the surface (see FIG. 20).

In the case of low melting point material Al, the recrystallization temperature is about 150° C., and when a film is formed at substrate temperature of about 200 to 300° C., crystal grains are formed like a stone hedge, and undulations are also formed on the surface (see FIG. 21). In addition, when TiN is used as the barrier layer to the dielectric film, a laminated structure with the lower electrode layer is formed, and hence the undulations are further emphasized (see FIG. 22).

Besides, depending on the film forming condition or stress at the time of forming the lower electrode layer, hillocks are formed, and surface undulations are similarly formed although the degree is different depending on the metal materials (not shown).

When the capacitor element composed of the lower electrode layer formed of these metal materials by sputtering, the dielectric layer thereon, and upper electrode layer is made to function, the leak current increases. That is, as shown in FIG. 20, FIG. 21, and FIG. 22, when the dielectric film is formed on the crystal grains of the lower electrode 1, or rugged undulated surface (lower electrode surface) represented by hillocks, the dielectric film 2 is laminated unevenly on the surface of the lower electrode 1 due to the effects of undulations as shown in FIG. 23A and FIG. 24A, the leak current increases due to concentration of an electric field. In particular, in the boundary (crystal grain boundary) of crystal grain 3 and crystal grain 3 on the surface of the lower electrode 1, since the individual crystal grain shapes are different, steep grooves 4 are formed depending on the location, and when the dielectric film 2 is formed on such surface of the lower electrode 1, the dielectric film 2 is deposited unevenly at the crystal grain boundary.

For example, when the lower electrode is made of high melting point metal material of TiN, the dielectric film is made of $Ta_2O_5$, and the upper electrode is made of TiN, the leak current characteristic of the capacitor element becomes as shown by curve b in FIG. 19. It is known from FIG. 19 that the capacitor element of such composition evidently has a leak current not withstanding a practical use.

Such conventional capacitor element, more specifically the MIM type capacitor element composed of a film of high dielectric constant involves the following problems.

(1) Surface undulations represented by crystal grain shapes or hillocks of the lower electrode are present, regardless of the manufacturing methods of the MIM type capacitor element, whether the crystal grain shapes are columnar or like a stone hedge as shown in FIG. 23A and FIG. 24A. Due to the effects of surface undulations, the dielectric film 2 is deposited unevenly, and the capacity drops, the leak current increases, the film uniformity deteriorates, and the capacitor element characteristics are extremely lowered. These problems are common when metal materials are used in the lower electrode 1, and in order to deposit the dielectric film 2 uniformly, it is preferred that the interface of the lower electrode 1 contacting with the dielectric film 2 is as flat as possible.

(2) Further, when the capacitor element is incorporated into a semiconductor device, as the dielectric film 1 becomes thinner with the acceleration of higher degree of integration and larger capacity, the dielectric film 2 is more likely to be deposited unevenly due to effects of surface undulations represented by crystal grain shapes or hillocks on the surface of the lower electrode 1 as shown in FIG. 23A to C, and FIG. 24A to C. That is, the capacity drops, the leak current increases, the film uniformity deteriorates, and the capacitor element characteristics are extremely lowered, and therefore the higher degree of integration while maintaining the required characteristics is a common subject regardless of the manufacturing methods of MIM type capacitor elements, and its limit has come to be known at the present.

SUMMARY OF THE INVENTION

It is hence an object of the invention to present a capacitor element free from capacity drop, leak current increase, film uniformity deterioration due to surface undulations represented by crystal grain shapes or hillocks of the lower electrode, and its manufacturing method.

The capacitor element of the invention is a capacitor element comprising a lower electrode, a dielectric film, and an upper electrode, in which the lower electrode has a single-layer structure or a laminated structure, and the surface of at least one layer is formed by processing and flattening the material itself which composes the surface. The surface of at least one layer of the lower electrode can be flattened by filling up the recesses of the surface, that is, recesses due to the crystal grain boundary or hillock formed on the surface (same hereinafter), with the material itself shaved from the surface. The surface of at least one layer of the lower electrode can be made amorphous and flattened.

The surface of at least one layer of the lower electrode can be made amorphous and flattened by simultaneously filling up the recesses of the surface with this amorphous matter. The surface of at least one layer of the lower electrode can be flattened by filling up the recesses with the material itself shaved from the surface and making part or the whole of the surface amorphous. At least one layer of the lower electrode, or at least its surface has a polycrystalline structure, and the crystal grain shape has, for example, any one of columnar crystal grain structure, stone hedge crystal grain structure, etc.

The capacitor element of the invention is a capacitor element comprising a lower electrode, a dielectric film, and an upper electrode, in which the surface of the lower electrode contacting with the dielectric film is flattened by processing the material itself which composes the surface. The surface of the lower electrode contacting with the dielectric film can be flattened by filling up the recesses of the surface with the material itself shaved from the surface. The capacitor element of the invention is a capacitor element comprising a lower electrode, a dielectric film, and an upper electrode, in which the surface of the lower electrode contacting with the dielectric film can be made amorphous and flattened. The surface of the lower electrode contacting with the dielectric film can be made amorphous and flattened by simultaneously filling up the recesses of the surface with this amorphous matter. The surface of the lower electrode contacting with the dielectric film can be flattened by filling up the recesses of the surface with the material itself shaved from the surface and making part or the whole of the surface amorphous. The capacitor element of the invention is a capacitor element comprising a lower electrode, a dielectric film, and an upper electrode, in which a reaction layer is formed by reaction gas on the flattened surface of the lower electrode contacting with the dielectric film. The reaction layer of the surface of the lower electrode contacting with the dielectric film can be formed on the lower electrode surface after flattening by filing up the recesses of the surface with the material itself shaved from the lower electrode surface, or after flattening by making the lower electrode surface amorphous and simultaneously filling up the recesses of the surface with the amorphous matter, or after flattening by filling up the recesses of the surface with the material itself shaved from the lower electrode surface and making the surface amorphous. The lower electrode may be either a single-layer structure or laminated structure. At least a layer of the lower electrode contacting with the dielectric film, or at least its surface has a polycrystalline structure, and the crystal grain shape has, for example, any one of columnar crystal grain structure, stone hedge crystal grain structure, etc.

The layer of the lower electrode to be flattened, at least one layer of the lower electrode, or the layer of the lower electrode at least contacting with the dielectric film can be formed of a metal or a compound having a composition of metal element. Part of at least one layer of the lower electrode, or part of the layer of the lower electrode at least contacting with the dielectric film can be formed of a metal compound.

A manufacturing method of capacitor element of the invention comprises a step of flattening the surface of at least one layer of a lower electrode of a single layer structure or laminated structure by processing the surface itself, and a step of forming a dielectric layer and an upper electrode on the lower electrode. At least one layer of the lower electrode has a polycrystalline structure, and the crystal grain shape is, for example, any one of columnar crystal grain structure, stone hedge crystal grain structure, etc. At least one layer of the lower electrode can be formed by depositing a metal or a compound having a composition of metal element, or part of a layer of the lower electrode can be formed by depositing a metal compound. In the invention, undulations of the surface of at least one layer of the lower electrode deposited on the substrate are lessened by processing the material itself which composes the surface. When the lower electrode is deposited by a laminated structure composed of multiple layers, the surface undulations may be lessened in the intermediate layer or in every layer, or surface undulations of the uppermost layer may be lessened.

Surface treatment for lessening, that is, flattening the surface undulations of the lower electrode layer includes, for example, surface treatment making use of plasma particles in the plasma, more specifically surface treatment by generating a plasma so that plasma particles can be obliquely incident on the lower electrode surface, or surface treatment making use of ions by ion beam, more specifically surface treatment for making ion beams obliquely incident on the lower electrode surface, thereby shaving the bumps of the undulated surface and burying part of the shaved lower electrode layer in the recesses of the surface.

Further specifically, (1) Surface treatment is applied on undulations at the interface contacting with the dielectric film.

(2) In the case of the lower electrode being a laminated structure, surface treatment is applied on undulations of the intermediate layer other than the interface between the lower electrode and dielectric film, the crystal grain shape in each layer or hillocks.

(3) Surface treatments of (1) and (2) may be combined.

The surface treatment of the lower electrode layer is executed by using either an RIE (Reactive Ion Etching) apparatus or an ion injection apparatus, and by the technology of injecting rare gas ions obliquely, the surface can be smoothed by physical sputter etching using rare gas ions. This technology is an applied technique of a conventional Ar sputter etching method for smoothing the interlayer insulating film for composing the wiring layer, or for forming a taper surface in a step portion of the contact hole of a semiconductor device.

In the surface treatment by making use of plasma particles in the plasma, it is desirable to employ no-magnetic field parallel flat plate type RIE apparatus, ECR (Electron Cyclotron Resonance) type RIE apparatus, or magnetic field assist type RIE apparatus. As the rare gas, one or plural types of rare gas may be used by selecting, for example, from He gas, Ne gas, Ar gas, Kr gas, Xe gas, and Rn gas.

The surface treatment by making use of ions by ion beam is realized by the ion injection method. In the surface treatment by the ion injection method, it is desirable to employ rare gas ions, one or plural types of rare gas, for example, from He ion, Ne ion, Ar ion, Kr ion, Xe ion, and Rn ion. Or the element ion of the material for composing the lower electrode may be used. A mixture gas of the element gas of the material for composing the lower electrode and the rare gas listed above may be used. When using a mixture gas with rare gas, in particular, Ar gas and inert gas (including $N_2$), it is easier to form a plasma.

As the surface treatment for lessening, that is, flattening the surface undulations of the lower electrode layer, for example, the undulated surface of the lower electrode layer may be made amorphous by beating with ions, and flattened. As the ions to be used in this process, the ions of the element for composing the material of the lower electrode may be used. By making amorphous, simultaneously, part of the amorphous matter may be buried in the recesses of the surface to flatten the surface of the lower electrode layer. Alternatively, the undulated surface of the lower electrode layer may be flattened by shaving the bumps to bury in the recesses of the surface by making use of plasma particles in the plasma or by using ions by ion beam, and then making amorphous part or the whole of the surface of the lower electrode layer.

As the surface treatment of the lower electrode, further, the undulated surface of the lower electrode contacting with the dielectric film can be lessened (that is, flattened) while reacting with a reaction gas not using halogen gas, for example, nitrogen gas, oxygen gas, or other reaction gas ($NH_3$) containing nitrogen or oxygen. At this time, a reaction layer is formed on the surface of the lower electrode. When the lower electrode is made of, for example, TiN, the reaction layer becomes TiN, TiO, or TiON layer. In the case of other electrode materials given below, a reaction layer containing nitrogen, oxygen, or nitrogen and oxygen is formed. As the reaction gas, it is preferred to form a reaction layer by using an element gas of the material which composes the surface of the lower electrode. After the flattening step of the lower electrode, a reaction layer may be formed on the surface of the lower electrode.

This reaction layer can suppress reaction between the dielectric film and the lower electrode.

The step of flattening the lower electrode and step of forming a dielectric film thereon, or the step of flattening the lower electrode, step of forming a reaction layer thereon, and step of forming a dielectric film on the reaction layer can be done continuously in reduced pressure condition without being exposed to the atmosphere.

The electrode material of the layer contacting with the flattened layer of the lower electrode, for example, at least one layer of the lower electrode or at least the lower electrode contacting with the dielectric layer is at least one material selected from the group consisting of metals such as Al, W, Mo, Co, Ti, Ta, Cu, Pt, Ru, Rh, Pd, Os, and Ir, silicide compounds of these metals, carbon compounds of these metals, nitrogen compounds of these metals, oxygen compounds of these metals, and intermetallic compounds of these metals, that is, it is preferred to use one type or plural types of materials selected from this group.

The material of the dielectric film is at least one material selected from the group consisting of transition metal oxides, Ti oxide barium compound, and its substituent compound (Ba, Sr, Bi, Pb, Ca).(Ti, Zr, Sn) oxide compound, that is, it is desirable to use one type or plural types of materials selected from this group. The film thickness of the dielectric film may be 100 nm or less.

As the electrode material for composing the upper electrode, for example, the same material as the lower electrode may be used.

In at least one layer of the lower electrode composing the capacitor element, the surface which is deposited with a metal or a compound having a composition of a metal element or partially deposited with a metal compound has a polycrystalline structure and is undulated in shape. For example, the surface of the layer of the lower electrode contacting with the dielectric film is polycrystalline in structure and undulated in shape. In the invention, since this surface is flattened by processing the material itself which composes the surface, the film thickness of the dielectric film formed on the lower electrode is uniform, and therefore the leak current is decreased, the capacity is increased, and the dielectric film quality is homogenized.

In the manufacturing method of capacitor element, by depositing at least one layer of the lower electrode with a metal, or a compound having a composition of a metal element, or a metal compound in part of the surface, the surface of this layer is an undulated shape having a polycrystalline structure. In the invention, after depositing, the surface of the layer is flattened by processing the material itself of the surface, and therefore the undulated surface represented by crystal grain shapes or hillocks is smoothed. For example, by flattening the surface contacting with the dielectric film, or by flattening the intermediate layer surface and forming a subsequent layer by using a material having smaller undulations, the film thickness of the dielectric film formed on the flattened lower electrode is uniform, and the degree of integration becomes higher and the capacity is larger, thereby reducing the thickness of the dielectric film.

According to the invention, if the lower electrode has a single-layer structure or multi-layer structure, regardless of the crystal grain shape such as columnar or stone hedge shape, by the surface treatment making use of plasma particles in the plasma, or surface treatment making use of ions by ion beams, the undulated surface of the lower electrode represented by crystal grain shapes or hillocks can be smoothed. When the lower electrode is a multi-layer structure, in the case of surface treatment of at least one layer, for example, the uppermost layer, the undulated surface of the lower electrode represented by crystal grain shapes or hillocks can be smoothed. Or, in the case of surface treatment of one intermediate layer, by forming an upper layer by using an electrode material having smaller undulations, a nonmetallic electrode material such as polysilicon, the undulated surface of the lower electrode represented by crystal grain shapes or hillocks can be smoothed. In the case of a multi-layer structure, a part of the layer may be composed by using a nonmetallic electrode material such as polysilicon.

In the undulated surface of the lower electrode, by implanting ions of the element for composing the electrode material of the lower electrode to make the surface amorphous, or making amorphous and simultaneously filling the recesses in the crystal grain boundary with the amorphous matter, the undulated surface of the lower electrode represented by crystal grain shapes or hillocks can be smoothed. Further, by the surface treatment making use of plasma particles in the plasma, or surface treatment making use of ions by ion beams, undulations of the lower surface of the lower electrode may be lessened, and the lessened surface side is made amorphous to be smooth. In the surface treatment making use of ions by ion beams, when using the element ions of the material for composing the lower electrode are used, the flattened lower electrode surface is not changed in material quality, and it is extremely preferred because the characteristics of capacitor element are not changed.

When the surface of at least one layer of the lower electrode, or the side of the lower electrode contacting with the dielectric film is flattened by the same material as in the lower electrode, other electric characteristics such as resistance are not changed, or reaction changes with the dielectric film are not caused, and the reliability as the capacitor element can be maintained.

Therefore, the film thickness of the dielectric film can be reduced as the degree of integration and larger capacity accelerates, and a capacitor element free from capacity drop of capacitor element, increase in leak current, and deterioration of film quality uniformity can be manufactured. This capacitor element is preferably applied as a capacitor element to be installed, for example, in a semiconductor integrated device.

Moreover, by supplying reaction gas not using halogen gas, such as nitrogen gas, oxygen gas, or gas containing nitrogen and oxygen, on the undulated surface of the lower electrode so that the reaction gas reacts with the surface of the lower electrode, undulations are lessened, and the undulated surface of the lower electrode represented by crystal grain shapes or hillocks can be smoothed. Still more, by forming a reaction layer on the lower electrode surface, unnecessary reaction between the subsequently formed dielectric film and the lower electrode is hindered, and degeneration at the interface of the dielectric film is avoided, thereby enhancing the stabilization and reliability of the capacity value. When forming a reaction layer on the surface of the lower electrode contacting with the dielectric film, it is extremely preferred to use the element gas of the material for composing the lower electrode as the reaction gas because a reaction layer is formed on the entire surface by reacting with an unbound seed and the reaction layer itself is substantially the same in material quality as the lower electrode surface, so that the characteristics of the capacitor element are not changed. Therefore, the same as in the case above, the film thickness of the dielectric film can be reduced as the degree of integration and larger capacity accelerates, and a capacitor element of high reliability is presented. This capacitor element is preferably applied as a capacitor element to be installed, for example, in a semiconductor integrated device.

According to the capacitor element of the invention, since the surface of at least one layer of the lower electrode having a single-layer structure or multi-layer structure is flattened by processing the material itself which composes this surface, the dielectric film on the lower electrode can be formed uniformly. Therefore, the film thickness of the dielectric film can be reduced as the degree of integration and larger capacity accelerates, and a capacitor element of high reliability free from capacity drop, increase in leak current, and deterioration of film quality uniformity can be presented.

When flattening the surface of at least one layer of the lower electrode by filling up the recesses of the crystal grain boundary with the material itself shaved from this surface, the dielectric film on the lower electrode can be formed uniformly without degenerating the material itself of the lower electrode. When the surface of at least one layer of the lower electrode is made amorphous and flattened, the dielectric film on the lower electrode can be formed uniformly without degenerating the material itself of the lower electrode. When the surface of at least one layer of the lower electrode is made amorphous and flattened by simultaneously filling up the recesses of the crystal grain boundary of the surface with the amorphous matter, the dielectric film on the lower electrode can be formed uniformly without degenerating the material itself of the lower electrode. When the surface of at least one layer of the lower electrode is made amorphous and flattened after filling up the recesses of the crystal grain boundary of the surface with the amorphous matter, the dielectric film on the lower electrode can be formed uniformly without degenerating the material itself of the lower electrode. Therefore, the film thickness of the dielectric film can be reduced as the degree of integration and larger capacity accelerates, and a capacitor element of high reliability free from capacity drop, increase in leak current, and deterioration of film quality uniformity can be presented.

According to the capacitor element of the invention, since the surface of the lower electrode contacting with the dielectric film is flattened by processing the material itself which composes this surface, the dielectric film on the lower electrode can be formed uniformly. Therefore, the film thickness of the dielectric film can be reduced as the degree of integration and larger capacity accelerates, and a capacitor element of high reliability free from capacity drop, increase in leak current, and deterioration of film quality uniformity can be presented.

When flattening the surface of the lower electrode contacting with the dielectric film by filling up the recesses of the surface with the material itself shaved from this surface, the dielectric film on the lower electrode can be formed uniformly without degenerating the material itself of the lower electrode. When the surface of the lower electrode contacting with the dielectric film is made amorphous and flattened, the dielectric film on the lower electrode can be formed uniformly without degenerating the material itself of the lower electrode. When the surface of the lower electrode contacting with the dielectric film is made amorphous and flattened by simultaneously filling up the recesses of the surface with the amorphous matter, the dielectric film on the lower electrode can be formed uniformly without degenerating the material itself of the lower electrode. When the surface of the lower electrode contacting with the dielectric film is made amorphous and flattened after filling up the recesses of the surface with the amorphous matter, the dielectric film on the lower electrode can be formed uniformly without degenerating the material itself of the lower electrode. Therefore, the film thickness of the dielectric film can be reduced as the degree of integration and larger capacity accelerates, and a capacitor element of high reliability free from capacity drop, increase in leak current, and deterioration of film quality uniformity can be presented.

When a reaction layer is formed by reaction gas on the flattened surface of the lower electrode contacting with the dielectric film, the dielectric film can be formed uniformly on the lower electrode, and unnecessary reaction between the lower electrode and dielectric film can be blocked by the reaction layer, and the degeneration at the interface of the dielectric film can be avoided, so that the capacity is not changed. Therefore, the film thickness of the dielectric film can be reduced as the degree of integration and larger capacity accelerates, and a capacitor element of high reliability free from capacity drop, increase in leak current, and deterioration of film quality uniformity can be presented.

When the surface of at least one layer of the lower electrode, or the side of the lower electrode contacting with the dielectric element is flattened by the same material as in the lower electrode, the electric characteristics of the lower electrode such as resistance do not change, or the reaction changes with the dielectric film do not occur, and therefore the reliability as the capacitor element may be maintained.

In the manufacturing method of capacitor element of the invention, since the dielectric film and upper electrode are formed sequentially on the lower electrode by flattening the surface of at least one layer of the lower electrode of single-layer structure or multi-layer structure, preferably the side at least contacting with the dielectric element, by processing the surface itself, the dielectric film on the lower electrode can be formed uniformly, and the degree of integration becomes higher and the capacity is larger, thereby reducing the thickness of the dielectric film, and therefore the capacity element of high reliability free from capacity drop, increase in leak current, and deterioration of film quality uniformity can be presented.

When the surface of at least one layer of the lower electrode is flattened, preferably at least the side contacting with the dielectric film, by filling up the recesses of the surface with the material itself shaved from this surface, the dielectric film on the lower electrode can be formed uniformly without degenerating the material itself of the lower electrode. When the surface of at least one layer of the lower electrode, preferably at least the side contacting with the dielectric film is made amorphous and flattened, the dielectric film on the lower electrode can be formed uniformly without degenerating the material itself of the lower electrode. When the surface of at least one layer of the lower electrode, preferably at least the side contacting with the dielectric film is made amorphous and flattened by simultaneously filling up the recesses of the surface with the amorphous matter, the dielectric film on the lower electrode can be formed uniformly without degenerating the material itself of the lower electrode. When the surface of at least one layer of the lower electrode, preferably at least the side contacting with the dielectric film is flattened by filling up the recesses of the surface with the material itself shaved from the surface and then made amorphous, the dielectric film on the lower electrode can be formed uniformly without degenerating the material itself of the lower electrode. Therefore, the film thickness of the dielectric film can be reduced as the degree of integration and larger capacity accelerates, and a capacitor element of high reliability free from capacity drop, increase in leak current, and deterioration of film quality uniformity can be manufactured.

When a reaction layer by reaction gas on the flattened surface of the lower electrode contacting with the dielectric film is formed, the dielectric film can be formed uniformly on the lower electrode, and unnecessary reaction between the lower electrode and dielectric film can be blocked by the reaction layer, and the degeneration at the interface of the dielectric film can be avoided, so that the capacity is not changed. Therefore, similarly, the film thickness of the dielectric film can be reduced as the degree of integration and larger capacity accelerates, and a capacitor element of high reliability free from capacity drop, increase in leak current, and deterioration of film quality uniformity can be manufactured.

When the surface of the lower electrode is shaved by surface treatment making use of plasma particles in the plasma or by surface treatment making use of ions by ion beams, and flattened by filling the recesses in the crystal grain boundary, flattening is favorably processed. In the surface treatment making use of plasma particles in the plasma, by using rare gas, flattening can be processed favorably without having effects on the material quality of the electrode material.

In the surface treatment making use of ions by ion beams, by using rare gas ions or element ions of the material composing the lower electrode, flattening can be processed favorably without having effects on the material quality of the electrode material.

The lower electrode may be composed of either a single-layer structure or multi-layer structure. In the invention, at least one layer of the lower electrode has a polycrystalline structure, and the crystal grain shapes are deposited in columnar, stone hedge or other forms, and the surface of the lower electrode contacting with the dielectric film can be flattened precisely.

When at least one layer of the lower electrode is composed of a metal or a compound having a composition of a metal element, or when a part of at least one layer of the lower electrode is composed of a metal compound, the surface contacting with the dielectric film can be flattened precisely.

By carrying out the step of flattening the lower electrode and step of forming a dielectric film thereon, or the step of flattening the lower electrode, step of forming a reaction layer thereon, and step of forming a dielectric film on the reaction layer, continuously in reduced pressure condition without being exposed to the atmosphere, a dielectric film excellent in uniformity of film thickness and film quality can be obtained.

The invention is preferably applied to the MIM type capacitor element and its manufacturing method.

DETAILED DESCRIPTION OF THE PRESENTLY PREFERRED EMBODIMENTS

Figure 1A:
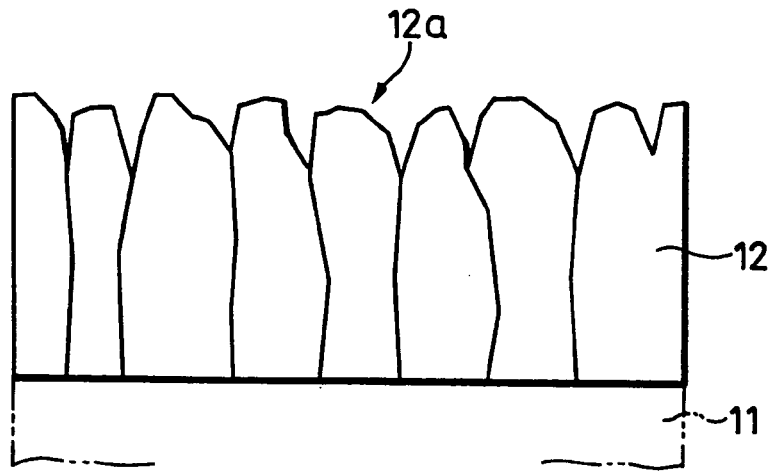
FIGS. 1A to C are manufacturing process charts (1) according to a first embodiment of capacitor element of the invention.

Referring now to the drawings, the embodiments of the invention are described below.

First Embodiment

Figure 18:
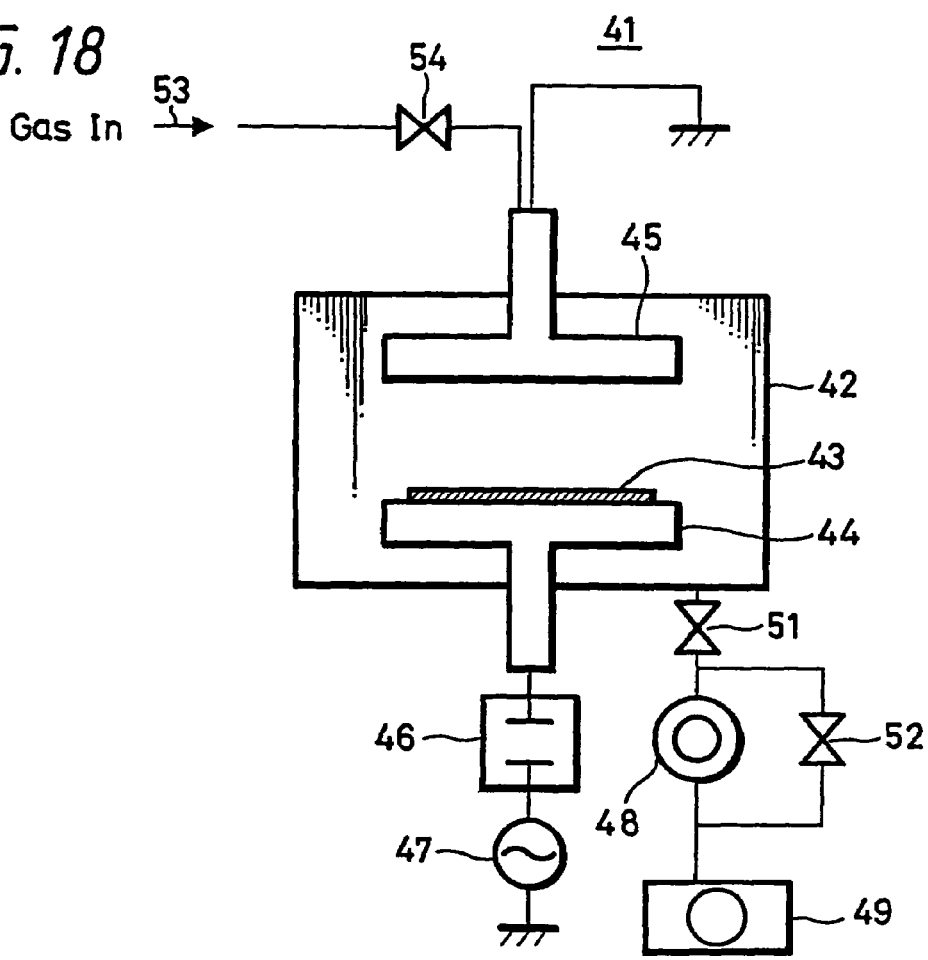
FIG. 18 is a schematic structural diagram showing a non-magnetic field parallel plate type RIE apparatus used in the embodiments of the invention.

First, referring to FIG. 18, the no-magnetic field parallel plate type RIE apparatus used in flattening of the surface of the lower electrode is explained.

The no-magnetic field parallel plate type RIE apparatus 41 has a reaction chamber 42 to be evacuated, and the reaction chamber 42 incorporates a lower electrode 44 also used as a sample table on which a substrate (for example, semiconductor wafer) 43 is placed, and an upper electrode 45 used, for example, also as a supply unit of processing gas, facing parallel to the lower electrode 44, and a specified high frequency bias is applied to the lower electrode 44 from a high frequency power supply 47 through a matching device 46, and a grounding potential is applied to the upper electrode 45. A high vacuum exhaust pump 48 and a rough exhaust pump 49 are connected to the reaction chamber 42 through valves 51 and 52, and by operating the rough exhaust pump 49 and then the high vacuum exhaust pump 48, the reaction chamber 42 is evacuated to a high vacuum. The processing gas 53 is supplied into the reaction chamber 42 from the upper electrode 45 serving also as the gas supply unit through a valve 54.

In this no-magnetic field parallel plate type RIE apparatus 41, when a required high frequency bias is applied between the lower electrode 44 and upper electrode 45 and processing gas 53 is supplied, a plasma is generated in the reaction chamber 42, and the substrate 43 on the upper electrode 44 is etched by the ions in the plasma.

In the embodiment, as shown in FIG. 1A, on a substrate, for example, a semiconductor substrate (not shown) composing a semiconductor integrated device, for example, an $SiO_2$ film 11 is formed as an insulating film, and on this $SiO_2$ film 11, a TiN layer 12 of film thickness of about 50 nm having a columnar crystal grain shape is formed as a wiring layer of the lower electrode by sputtering method. At this time, as shown in the diagram, undulations due to the profile of the columnar crystal grain shape are formed on the surface 12a of the TiN layer 12 of the lower electrode.

Next, using this no-magnetic field parallel plate type RIE apparatus 41, the surface of the TiN layer 12 of the lower electrode is smoothed under the following conditions.

| [Conditions] | |
| --- | --- |
| Gas flow rate | Ar gas, 200 sccm |
| Pressure | 46.0 Pa |
| RF bias | 4.9 W/cm$^2$ |
| Treating time | 30 sec |

Figure 1B:
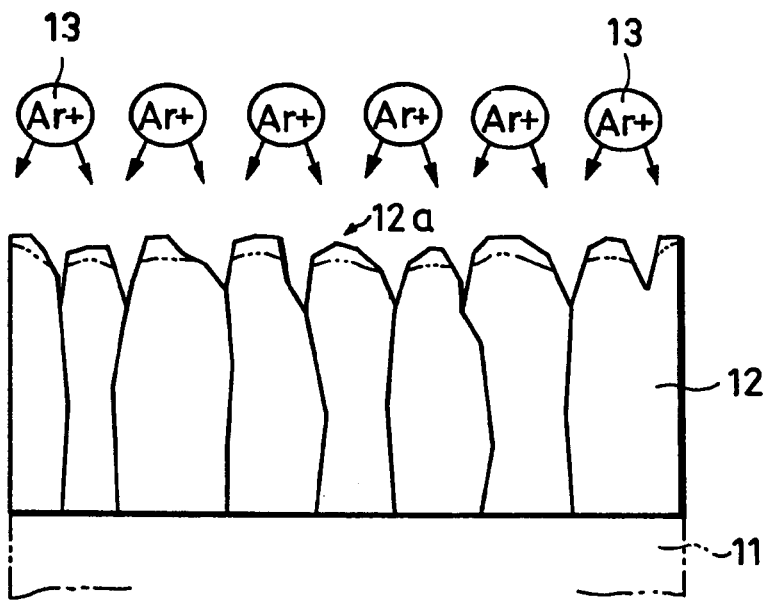
Figure 1C:
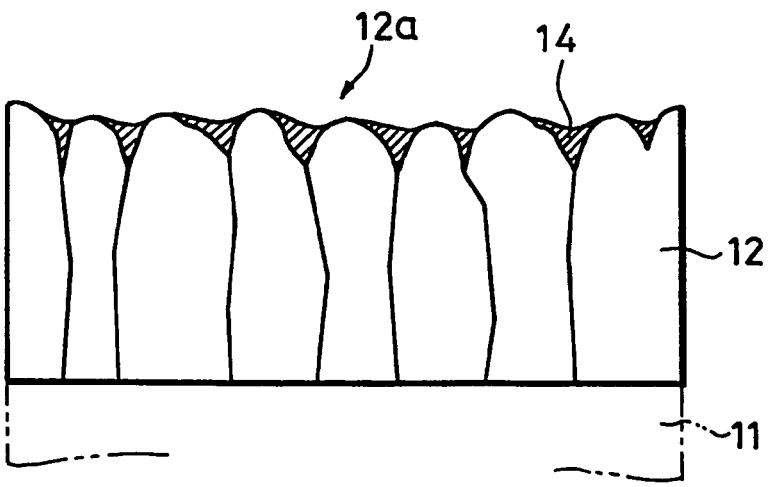

Under these conditions, as shown in FIG. 1B, by using rare gas, without using etching gas represented by halogen gas, undulations near the surface are physically sputtered and etched (that is, the surface bumps are shaved) by Ar ions 13 in the plasma. By this sputtering and etching, surface undulations of the TiN layer 12 of the lower electrode are lessened, and recesses in the crystal grain boundary are filled with TiN matter 14 being etched off from the bumps, and the surface 12a is flattened as shown in FIG. 1C. The TiN matter 14 being etched from the bumps forms part of the lower electrode 12. Yet, since only the undulated portion near the surface is etched, the film thickness of the lower electrode 12 is not changed substantially.

Figure 2D:
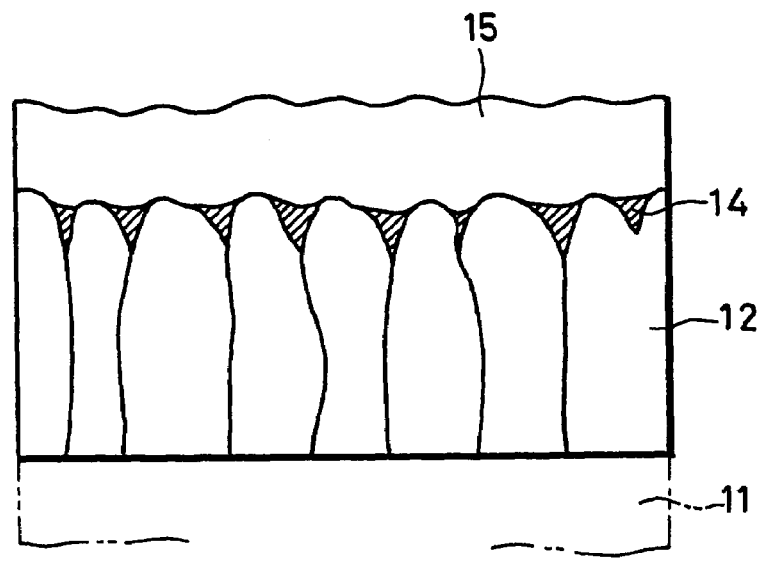
FIGS. 2D to E are manufacturing process charts (2) according to the first embodiment of capacitor element of the invention.

Next, as shown in FIG. 2D, for example, a $Ta_2O_5$ film 15 of 30 nm in thickness is formed on the surface of the lower electrode 12 as a dielectric film by plasma CVD method. The dielectric film 15 on the lower electrode 12 smoothed by surface treatment by making use of plasma particles in the plasma is deposited uniformly.

Figure 2E:
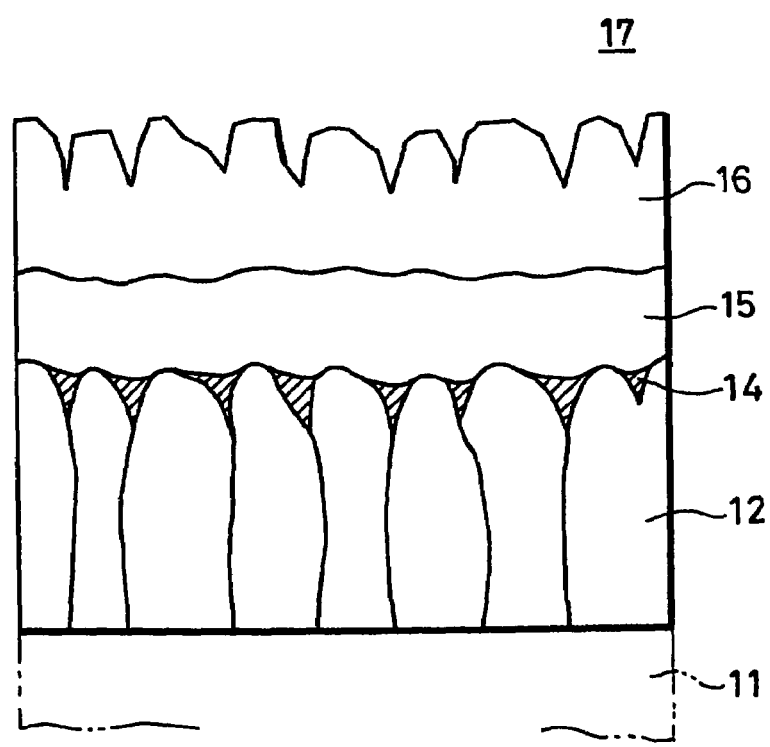

Then, as shown in FIG. 2E, an upper electrode 16 is formed on the dielectric film 15, and an intended capacitor element 17 is obtained.

Figure 19:
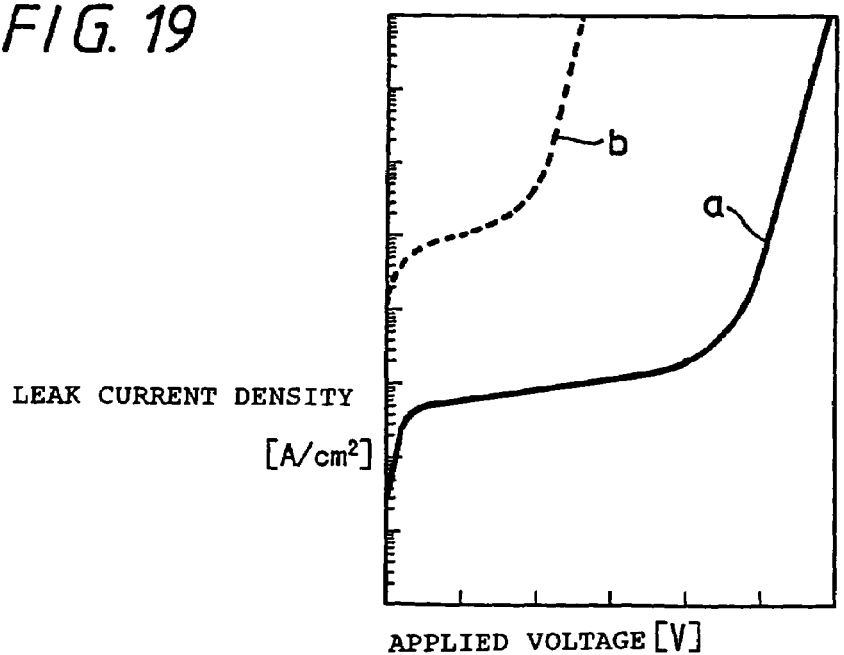
FIG. 19 is a comparative diagram of leak current characteristics of capacitor elements of the invention and a prior art.
Figure 20:
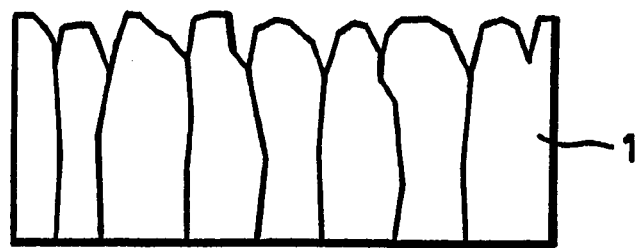
FIG. 20 is a structural diagram showing a lower electrode of columnar crystal grain structure.
Figure 21:
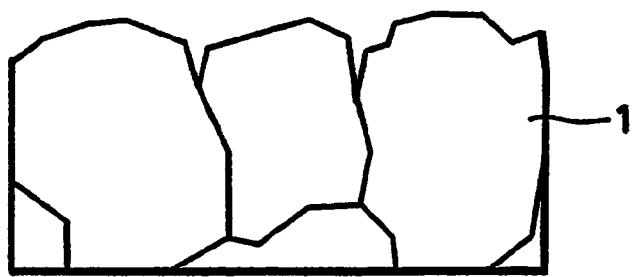
FIG. 21 is a structural diagram showing a lower electrode of stone hedge crystal grain structure.
Figure 22:
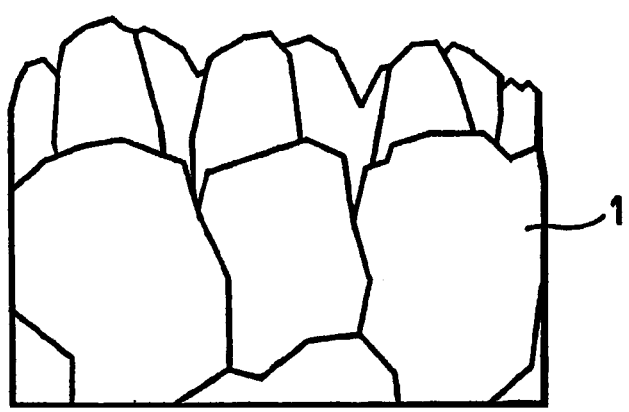
FIG. 22 is a structural diagram showing a lower electrode of laminated structure of stone hedge crystal grain structure and columnar crystal grain structure.
Figure 23A:
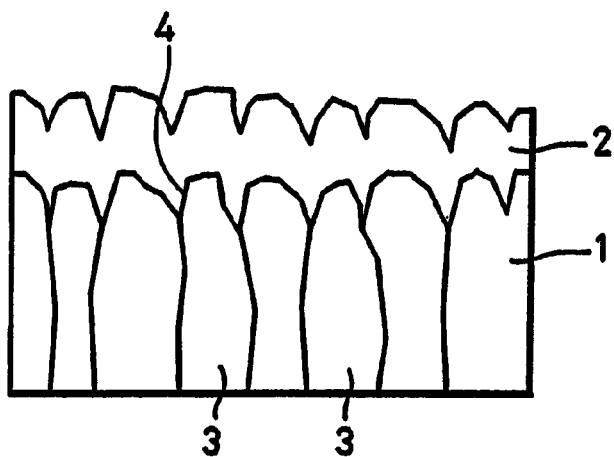
FIGS. 23A to C are structural diagrams showing the state of dielectric film surface when formed by varying the film thickness on the lower electrode of columnar crystal grain structure.
Figure 23B:
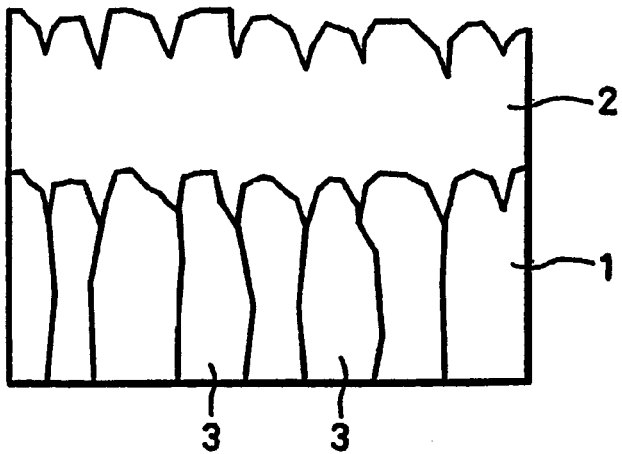
Figure 23C:
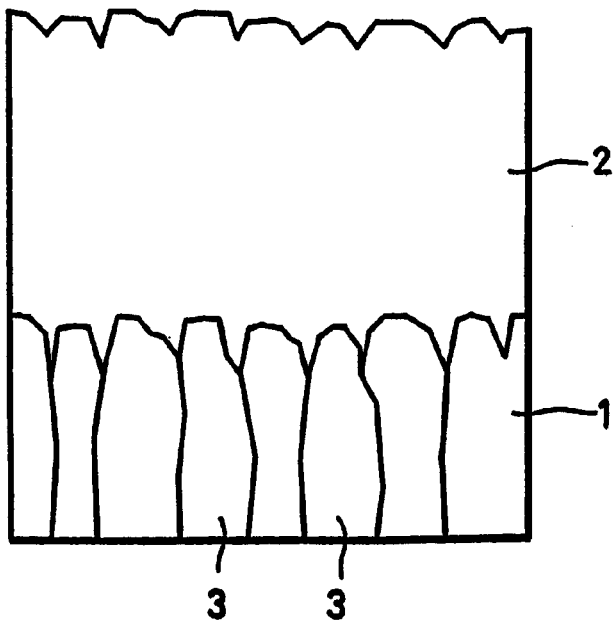
Figure 24A:
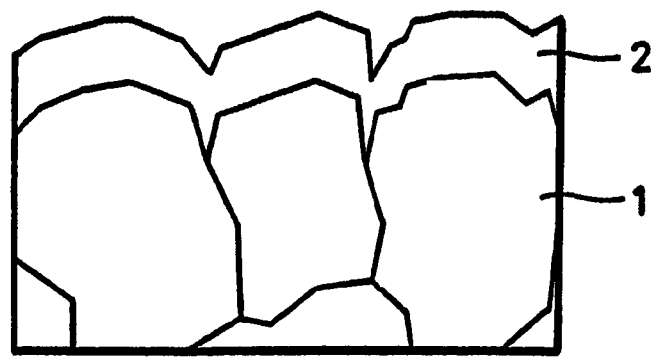
FIGS. 24A to C are structural diagrams showing the state of dielectric film surface when formed by varying the film thickness on the lower electrode of stone hedge crystal grain structure.
Figure 24B:
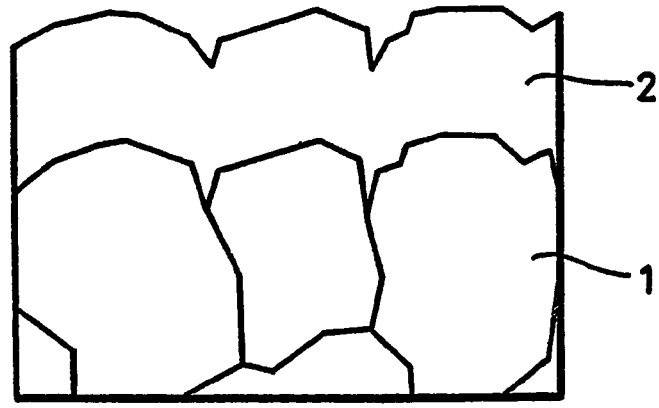
Figure 24C:
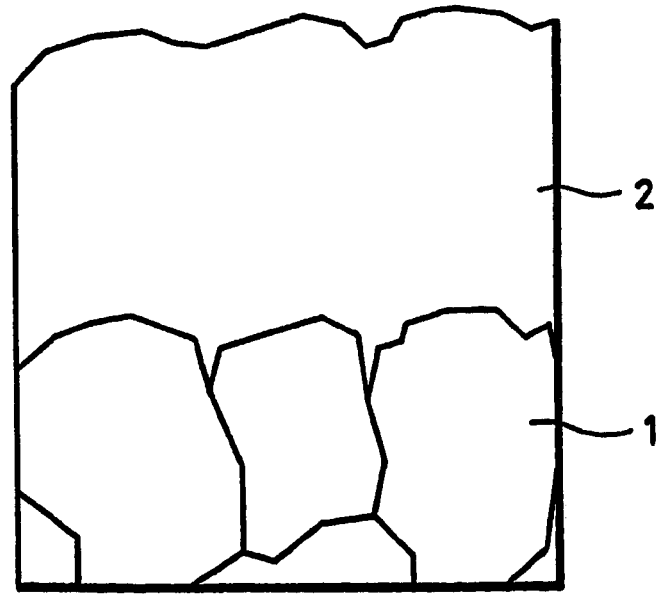

The leak current characteristic of this capacitor element 17 is indicated by curve "a" in FIG. 19. In the capacitor element 17 of the embodiment, as compared with a conventional capacitor element indicated by curve (b) in FIG. 8, the leak current is suppressed outstandingly.

Second Embodiment

Figure 3A:
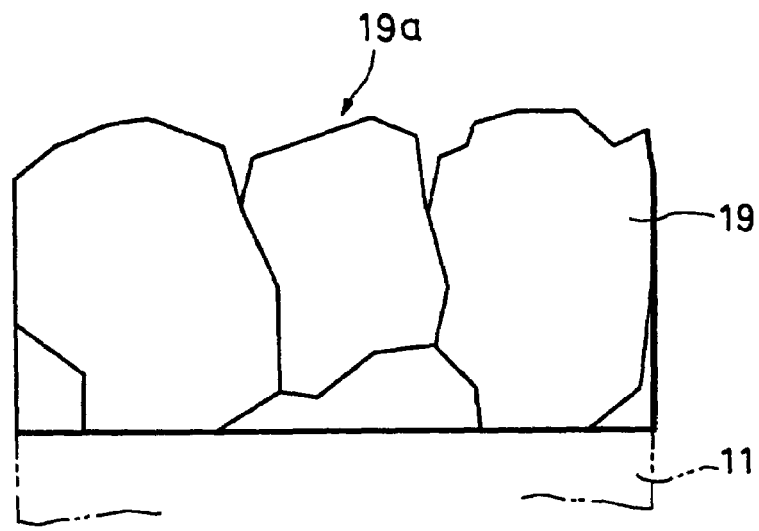
FIGS. 3A to C are manufacturing process charts (1) according to a second embodiment of capacitor element of the invention.

As shown in FIG. 3A, on a substrate, for example, a semiconductor substrate (not shown) composing a semiconductor integrated device, for example, an $SiO_2$ film 11 is formed as an insulating film, and on this $SiO_2$ film 11, an AlSi layer 19 of film thickness of about 50 nm having a stone hedge crystal grain shape is formed as a wiring layer of the lower electrode by sputtering method. At this time, as shown in the diagram, undulations due to the profile of the stone hedge crystal grain shapes are formed on the surface 19a of the AlSi layer 19 of the lower electrode.

Figure 3B:
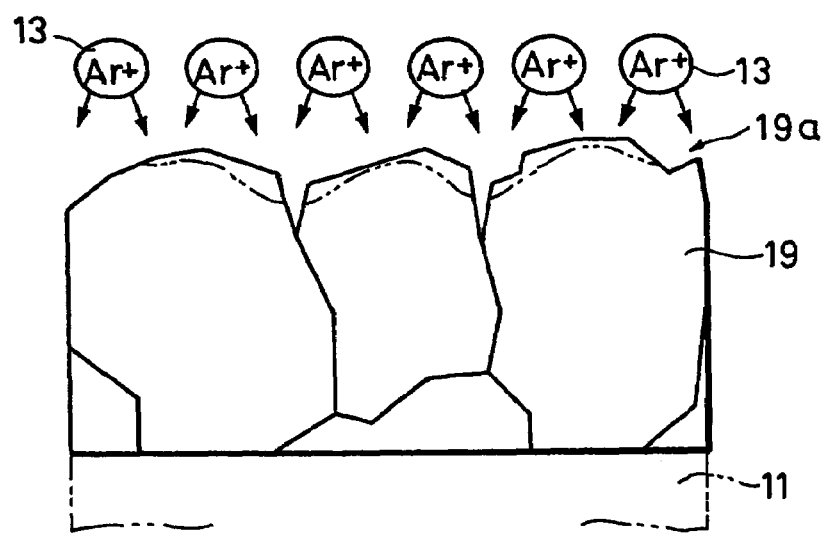
Figure 3C:
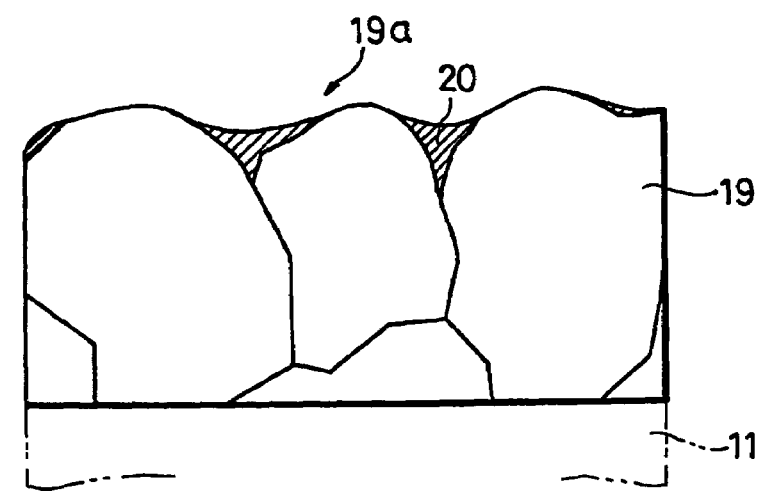

Next, using the no-magnetic field parallel plate type RIE apparatus 41, under the same condition as in a first embodiment, the surface of the AlSi layer 19 having the stone hedge crystal grain shape of the metal material of the lower electrode is treated. As shown in FIG. 3B, undulations near the surface are physically sputtered and etched (that is, the surface bumps are shaved) by Ar ions 13 in the plasma. By this sputtering and etching, surface undulations of the AlSi layer 19 of the lower electrode are lessened, and recesses in the crystal grain boundary are filled with AlSi matter 20 being etched off from the bumps, and the surface 19a is flattened as shown in FIG. 3C. The AlSi matter 20 being etched from the bumps forms part of the lower electrode 19. Yet, since only the undulated portion near the surface is etched, the film thickness of the lower electrode 19 is not changed substantially.

Figure 4D:
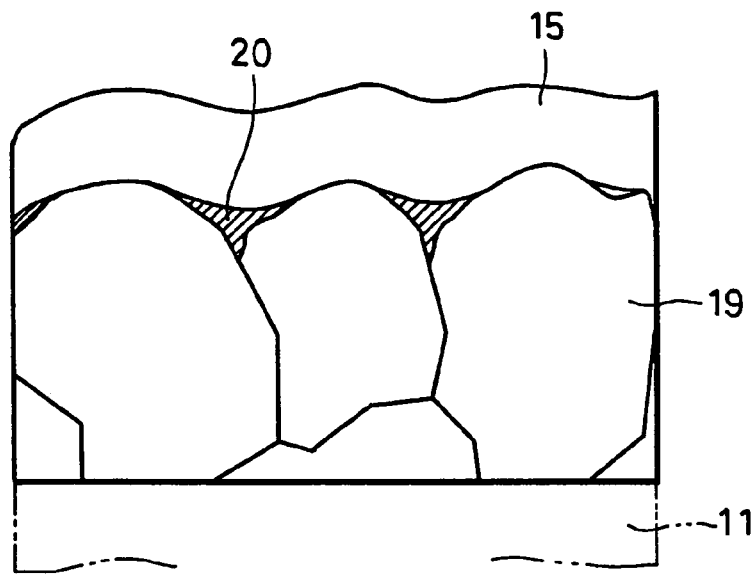
FIGS. 4D to E are manufacturing process charts (2) according to the second embodiment of capacitor element of the invention.

Next, as shown in FIG. 4D the same as in the first embodiment, for example, a $Ta_2O_5$ film 15 of 30 nm in thickness is formed on the surface of the lower electrode 19 as a dielectric film by plasma CVD method. The dielectric film 15 on the lower electrode 19 smoothed by surface treatment by making use of plasma particles in the plasma is deposited uniformly.

Figure 4E:
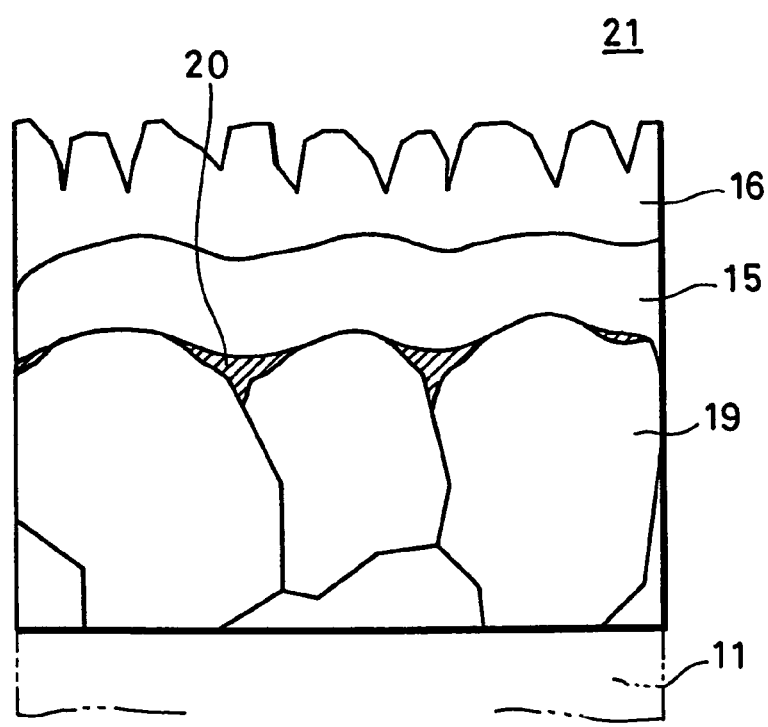

Then, as shown in FIG. 4E, an upper electrode 16 is formed on the dielectric film 15, and an intended capacitor element 21 is obtained.

In this capacitor element 21, too, the dielectric film 15 on the lower electrode 19 is deposited in a uniform film thickness, and the leak current is suppressed outstandingly as compared with the conventional capacitor element.

Third Embodiment

This embodiment is applied to a capacitor element in which the lower electrode has a laminated structure of metal material.

Figure 5A:
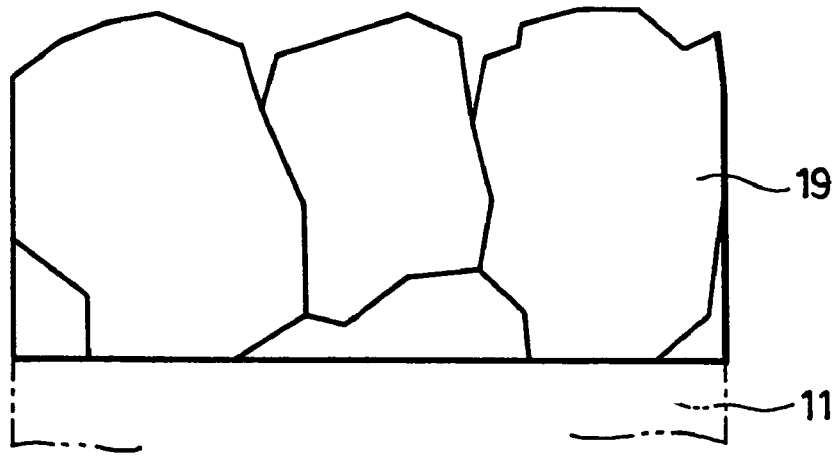
FIGS. 5A and B are manufacturing process charts (1) according to a third embodiment of capacitor element of the invention.

First, as shown in FIG. 5A, on a substrate, for example, a semiconductor substrate (not shown) composing a semiconductor integrated device, for example, an $SiO_2$ film 11 is formed as an insulating film, and on this $SiO_2$ film 11, a metal material of a first layer composing the lower electrode, that is, an AlSi layer 19 having a stone hedge crystal grain shape is formed by sputtering method.

Figure 5B:
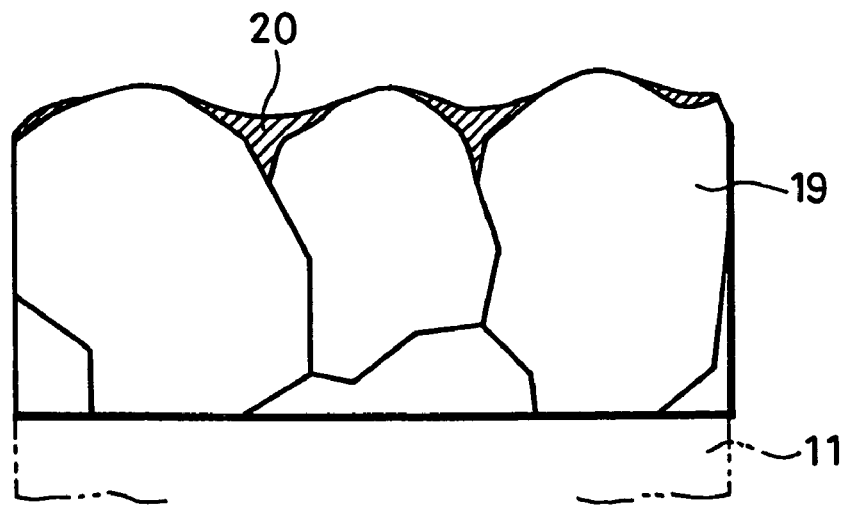

Next, as shown in FIG. 5B, using the no-magnetic field parallel plate type RIE apparatus 41, under the same condition as in the first embodiment, the surface of the AlSi layer 19 having the stone hedge crystal grain shape is treated. By this surface treatment by sputtering and etching, the same as explained in a second embodiment, surface undulations of the AlSi layer 19 are lessened, and recesses in the crystal grain boundary are filled with AlSi matter 20 being etched off from the bumps, and the surface is flattened.

Figure 6C:
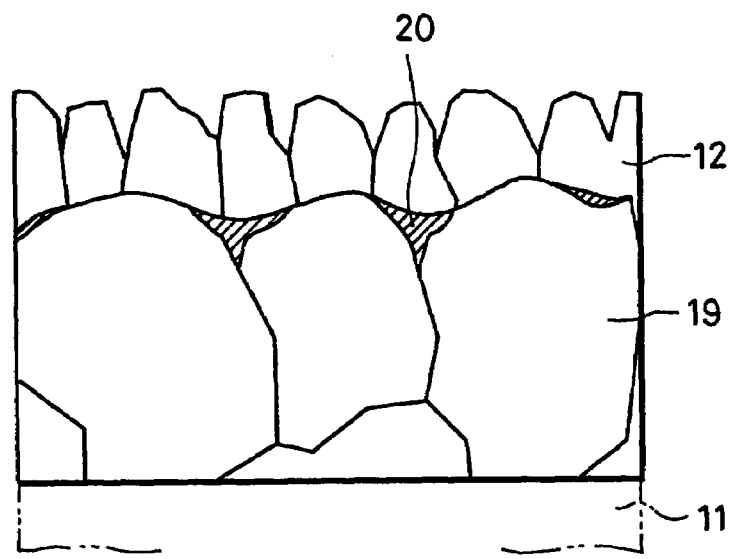
FIGS. 6C and D are manufacturing process charts (2) according to the third embodiment of capacitor element of the invention.

Then, as shown in FIG. 6C, on the AlSi layer 19 of the first layer of which surface is smoothed, a metal material of a second layer for composing the lower electrode, that is, a TiN layer 12 having a columnar crystal grain shape is formed by sputtering method.

Figure 6D:
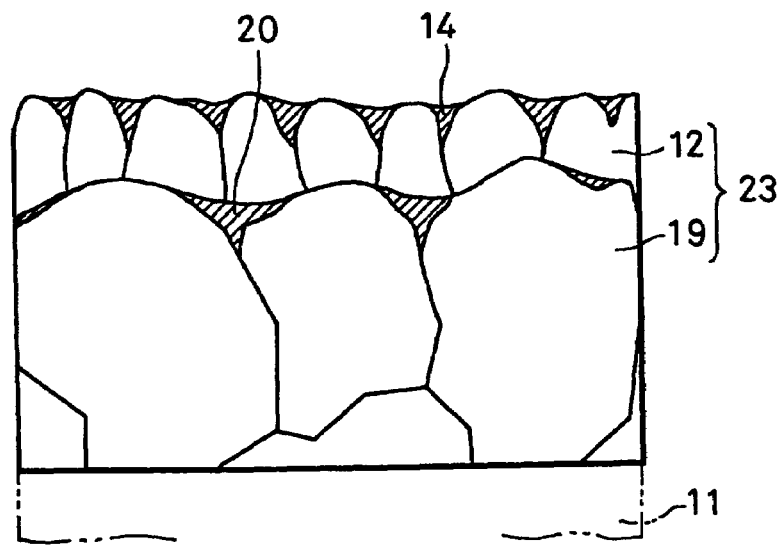

Further, as shown in FIG. 6D, using the no-magnetic field parallel plate type RIE apparatus 41, in the same condition as in the first embodiment, the surface of the TiN layer 12 having the columnar crystal grain shape is treated. By this surface treatment by sputtering and etching, same as explained in the first embodiment, surface undulations of the TiN layer 12 are lessened, and recesses in the crystal grain boundary are filled with TiN matter 14 being etched off from the bumps, and the surface is flattened. By the AlSi layer 19 of the first layer and the TiN layer 12 of the second layer, a lower electrode 23 is composed.

Figure 7E:
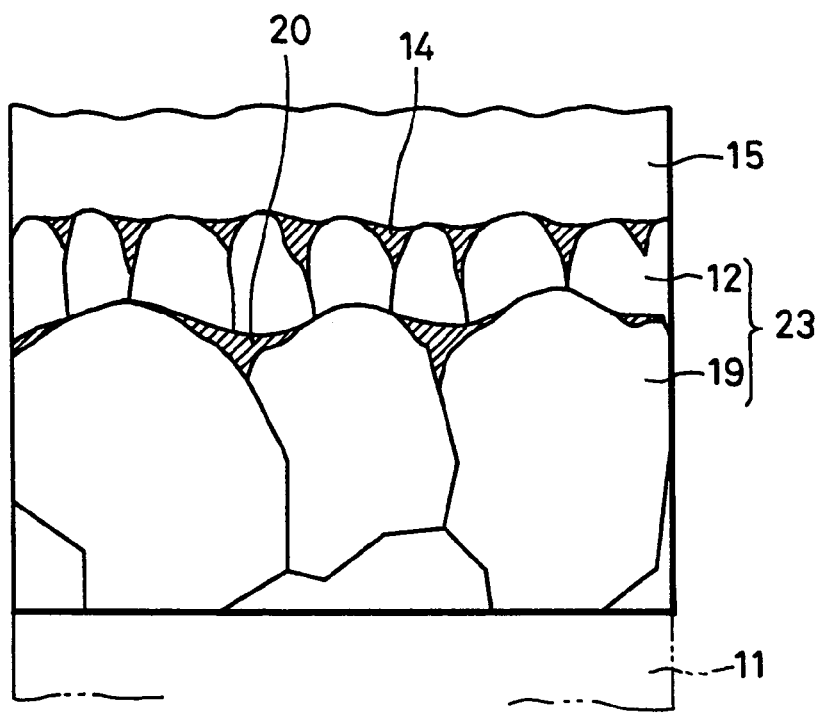
FIGS. 7E and F are manufacturing process charts (3) according to the third embodiment of capacitor element of the invention.

Consequently, as shown in FIG. 7E same as in the first embodiment, for example, a $Ta_2O_5$ film 15 of 30 nm in thickness is formed on the surface of the lower electrode 23 as a dielectric film by plasma CVD method. The dielectric film 15 on the lower electrode 23 smoothed by surface treatment by making use of plasma particles in the plasma is deposited uniformly.

Figure 7F:
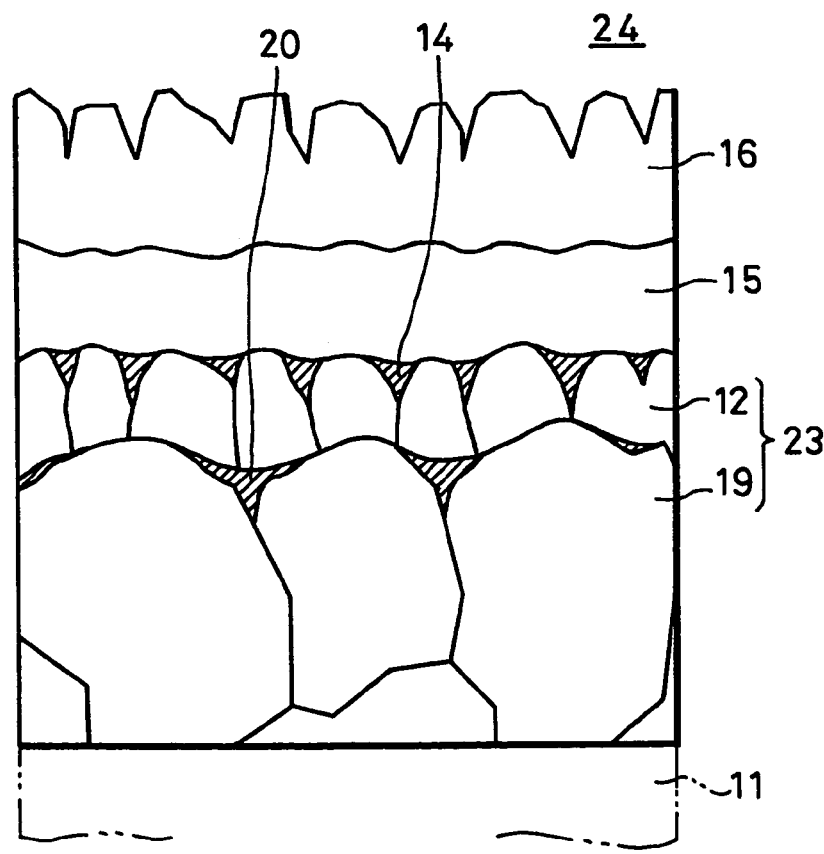

Then, as shown in FIG. 7F, an upper electrode 16 is formed on the dielectric film 15, and an intended capacitor element 24 is obtained.

In this capacitor element 24, too, the dielectric film 15 on the lower electrode 23 is deposited in a uniform film thickness, and the leak current is suppressed outstandingly as compared with the conventional capacitor element.

Fourth Embodiment

Figure 8A:
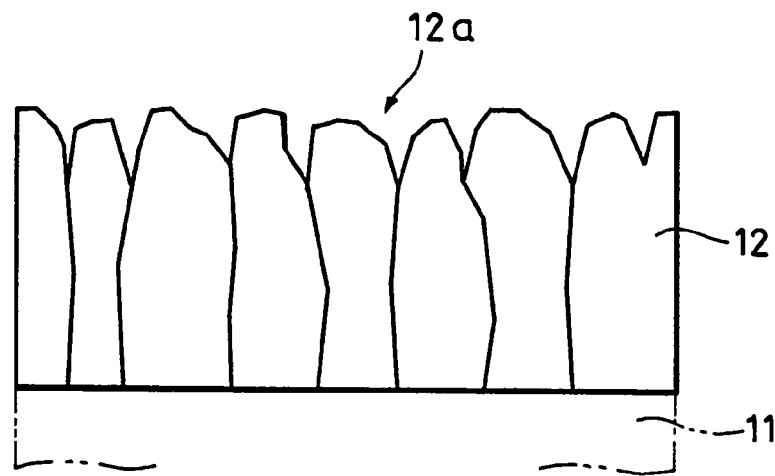
FIGS. 8A to C are manufacturing process charts (1) according to a fourth embodiment of capacitor element of the invention.

As shown in FIG. 8A, on a substrate, for example, a semiconductor substrate (not shown) composing a semiconductor integrated device, for example, an $SiO_2$ film 11 is formed as an insulating film, and on this $SiO_2$ film 11, a TiN layer 12 of about 50 nm in film thickness having a columnar crystal grain shape is formed as wiring layer of the lower electrode by sputtering method. At this time, as shown in the diagram, undulations due to the profile of the columnar crystal grain shape are formed on the surface 12a of the TiN layer 12 of the lower electrode.

Figure 8B:
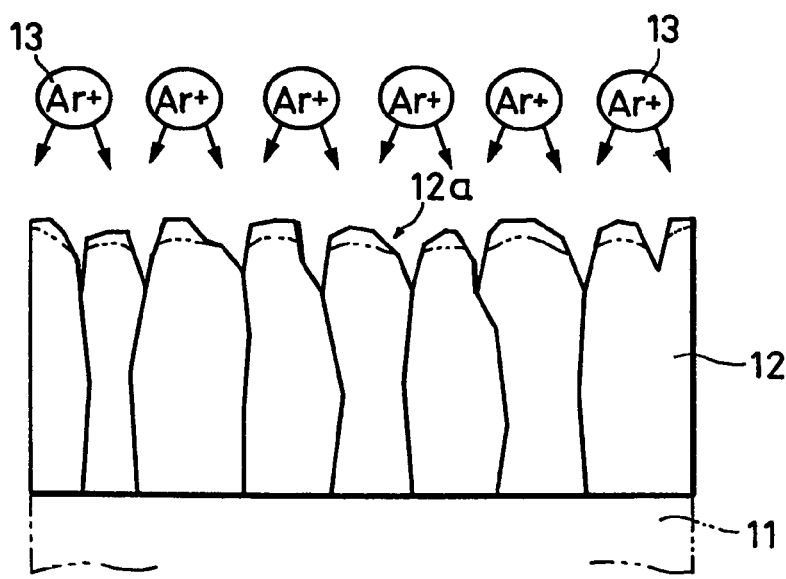
Figure 8C:
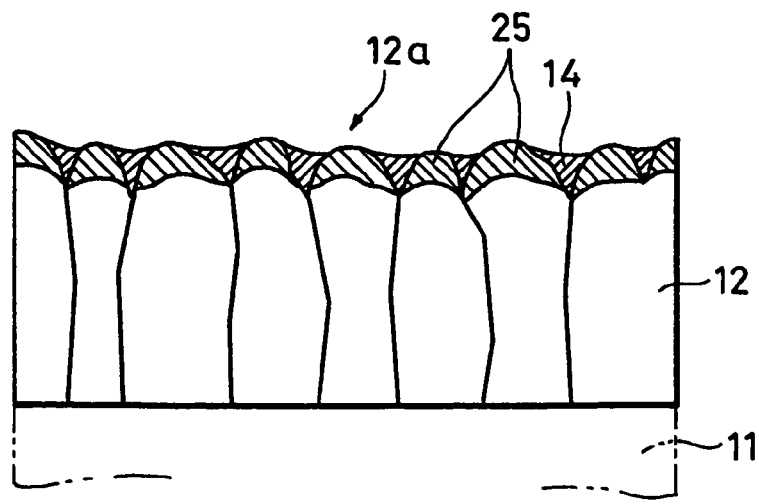

Next, in the same condition as in the first embodiment, the treating time is changed to 60 sec, using the no-magnetic field parallel plate type RIE apparatus 41, the surface of the TiN layer 12 having the columnar crystal grain shape of the metal material of the lower electrode is treated. As shown in FIG. 8B, undulations near the surface are physically sputtered and etched by Ar ions 13 in the plasma. By this sputtering and etching for a longer time than in the first embodiment, surface undulations of the TiN layer 12 of the lower electrode are lessened, and recesses in the crystal grain boundary are filled with TiN matter 14 being etched off from the bumps, and further part of the surface of the TiN layer 12 is made amorphous. As shown in FIG. 8C, the surface of the TiN layer 12 is flattened.

The TiN matter 14 being etched from the bumps and the amorphous layer 25 of the TiN layer surface form a part of the lower electrode. Yet, since only the undulated portion near the surface is etched, the film thickness of the lower electrode is not changed substantially.

Figure 9D:
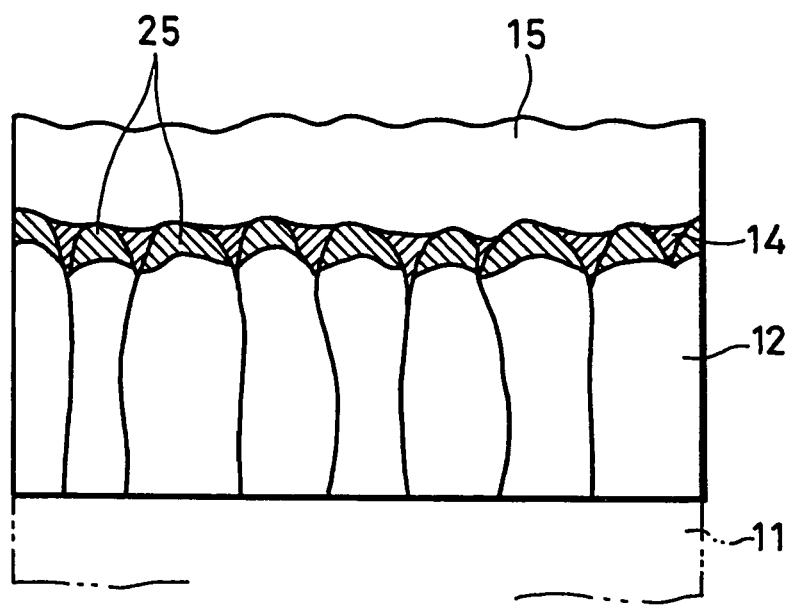
FIGS. 9D to E are manufacturing process charts (2) according to the fourth embodiment of capacitor element of the invention.

Next, as shown in FIG. 9D, for example, a $Ta_2O_5$ film 15 of 30 nm in thickness is formed on the surface of the lower electrode 12 as a dielectric film by plasma CVD method same as in the first embodiment. The dielectric film 15 on the lower electrode 12 smoothed by surface treatment by making use of plasma particles in the plasma is deposited uniformly.

Figure 9E:
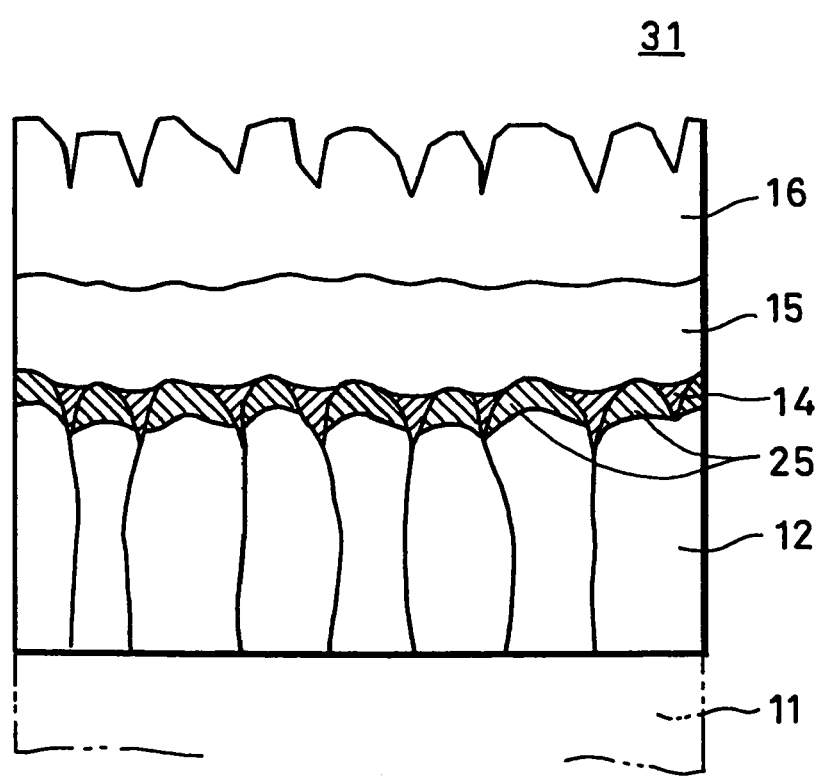

Then, as shown in FIG. 9E, an upper electrode 16 is formed on the dielectric film 15, and an intended capacitor element 31 is obtained.

In this capacitor element 31, too, the dielectric film 15 on the lower electrode 12 is deposited in a uniform thickness, and the leak current is suppressed outstandingly as compared with the conventional capacitor element.

Fifth Embodiment

Figure 10A:
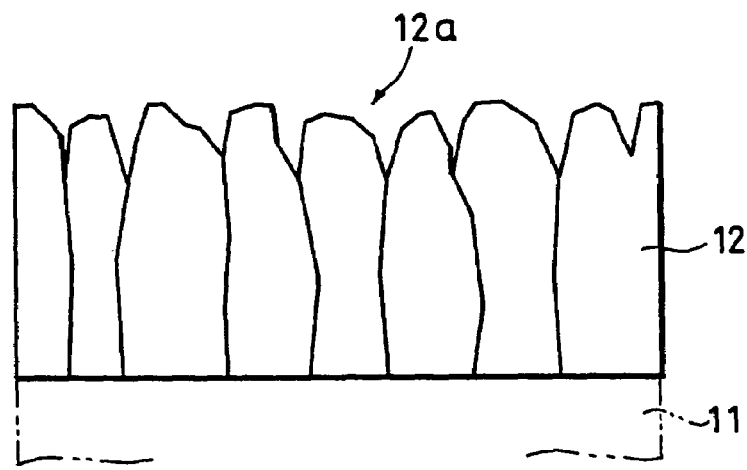
FIGS. 10A to C are manufacturing process charts (1) according to a fifth embodiment of capacitor element of the invention.

As shown in FIG. 10A, on a substrate, for example, a semiconductor substrate (not shown) composing a semiconductor integrated device, for example, an $SiO_2$ film 11 is formed as an insulating film, and on this $SiO_2$ film 11, a TiN layer 12 of about 50 nm in film thickness having a columnar crystal grain shape is formed as wiring layer of the lower electrode by sputtering method. At this time, as shown in the diagram, undulations due to the profile of the columnar crystal grain shape are formed on the surface 12a of the TiN layer 12 of the lower electrode.

Figure 10B:
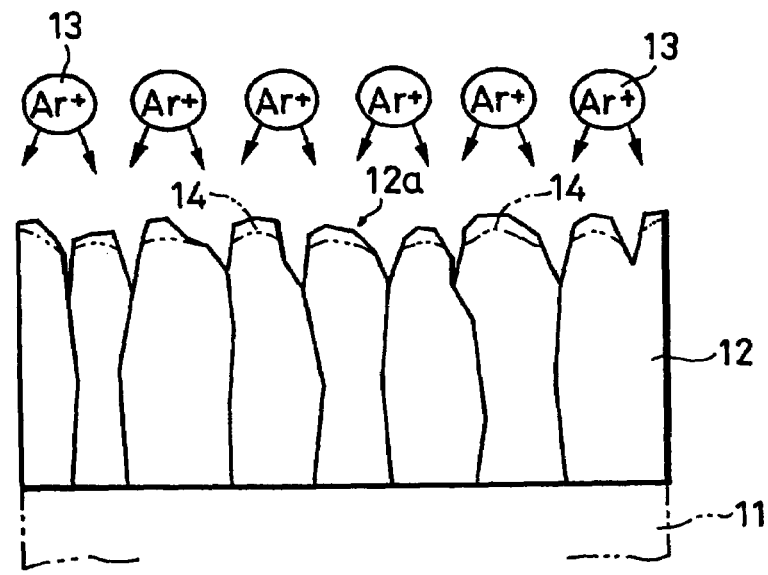
Figure 10C:
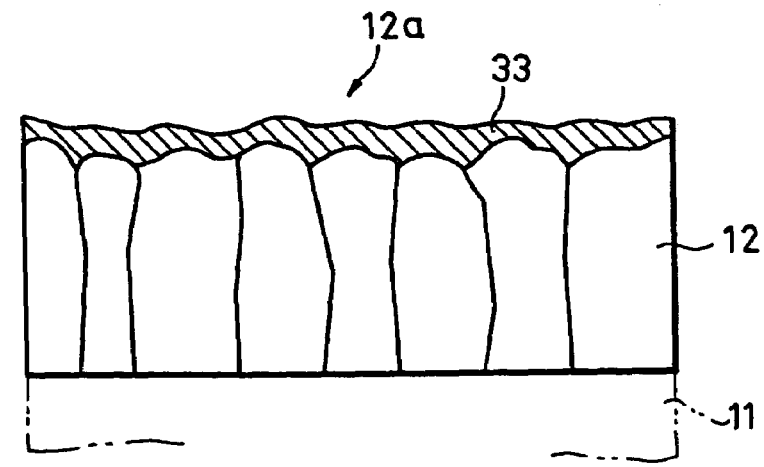

Next, in the same condition as in the first embodiment and a fourth embodiment, the treating time is changed to 120 sec, using the no-magnetic field parallel plate type RIE apparatus 41, the surface of the TiN layer 12 having the columnar crystal grain shape of the metal material of the lower electrode is treated. As shown in FIG. 10B, undulations near the surface are physically sputtered and etched by Ar ions 13 in the plasma. By this sputtering and etching, surface undulations of the TiN layer 12 of the lower electrode are lessened, and recesses in the crystal grain boundary are filled with TiN matter 14 being etched off from the bumps, and since the treating time is longer than in the fourth embodiment, the surface itself of the TiN layer 12 is made amorphous, and as shown in FIG. 10C, the surface of the TiN layer 12 is flattened.

The TiN matter 14 being etched from the bumps and the amorphous layer 33 of the TiN layer surface form a part of the lower electrode. Yet, since only the undulated portion near the surface is etched, the film thickness of the lower electrode is not changed substantially.

Figure 11D:
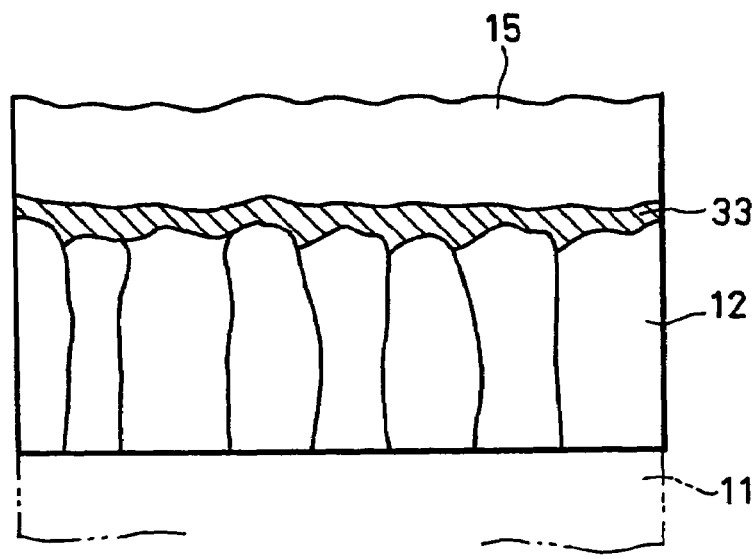
FIGS. 11D to E are manufacturing process charts (2) according to the fifth embodiment of capacitor element of the invention.

Next, as shown in FIG. 11D, for example, a $Ta_2O_5$ film 15 of 30 nm in thickness is formed on the surface of the lower electrode 12 as a dielectric film by plasma CVD method same as in the first embodiment. The dielectric film 15 on the lower electrode 12 smoothed by surface treatment by making use of plasma particles in the plasma is deposited uniformly.

Figure 11E:
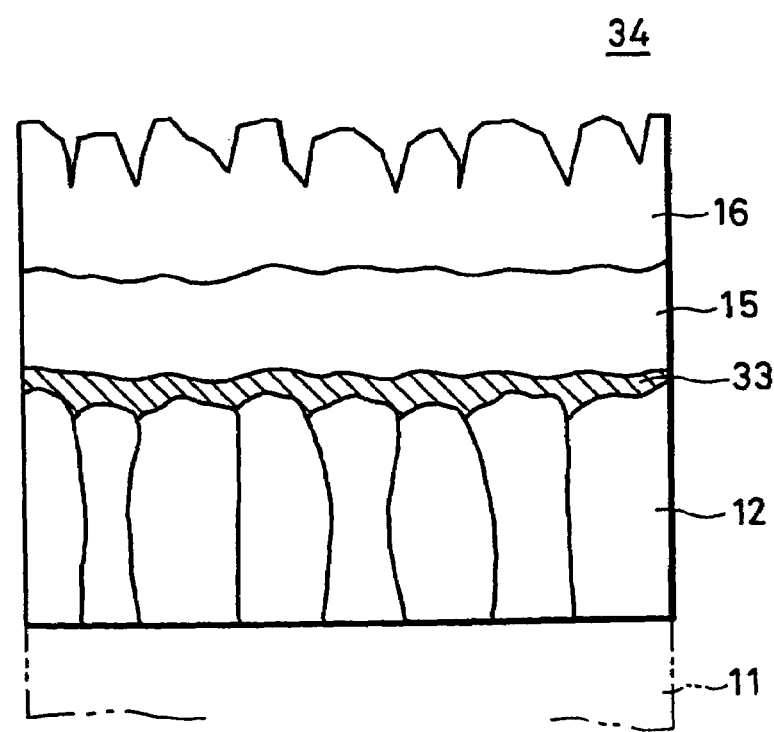

Then, as shown in FIG. 11E, an upper electrode 16 is formed on the dielectric film 15, and an intended capacitor element 34 is obtained.

In this capacitor element 34, too, the dielectric film 15 on the lower electrode 12 is deposited in a uniform thickness, and the leak current is suppressed outstandingly as compared with the conventional capacitor element.

Sixth Embodiment

Figure 12A:
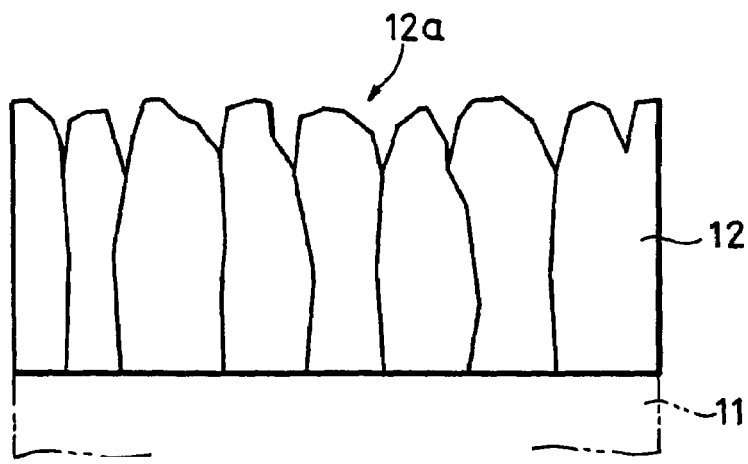
FIGS. 12A to C are manufacturing process charts (1) according to a sixth embodiment of capacitor element of the invention.

As shown in FIG. 12A, on a substrate, for example, a semiconductor substrate (not shown) composing a semiconductor integrated device, for example, an $SiO_2$ film 11 is formed as an insulating film, and on this $SiO_2$ film 11, a TiN layer 12 of about 50 nm in film thickness having a columnar crystal grain shape is formed as wiring layer of the lower electrode by sputtering method. At this time, as shown in the diagram, undulations due to the profile of the columnar crystal grain shape are formed on the surface 12a of the TiN layer 12 of the lower electrode.

Figure 12B:
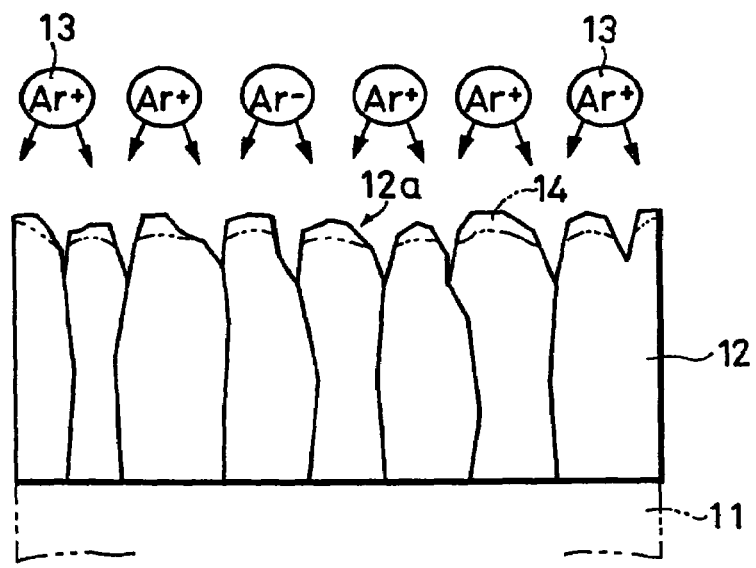

Next, in the same condition as in the first embodiment, using the no-magnetic field parallel plate type RIE apparatus 41, the surface of the TiN layer 12 having the columnar crystal grain shape of the metal material of the lower electrode is treated. As shown in FIG. 12B, undulations near the surface are physically sputtered and etched (that is, the surface bumps are ground off) by Ar ions 13 in the plasma. By this sputtering and etching, surface undulations of the TiN layer 12 of the lower electrode are lessened, and recesses in the crystal grain boundary are filled with TiN matter 14 being etched off from the bumps, and the surface of the TiN layer 12 is flattened.

In succession, using the no-magnetic field parallel plate type RIE apparatus 41, a reaction layer is formed on the flattened surface of the TiN layer 12 of the lower electrode in the following condition.

| [Condition] | |
| --- | --- |
| Gas flow rate | $N_2$ gas, 50 sccm |
| Pressure | 46.0 Pa |
| RF bias | 4.9 W/cm$^2$ |
| Treating time | 30 sec |

Figure 12C:
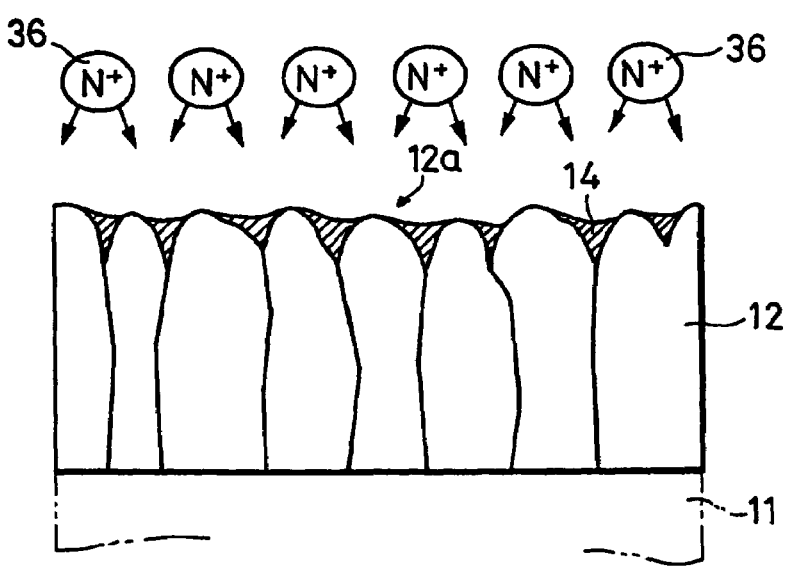
Figure 13D:
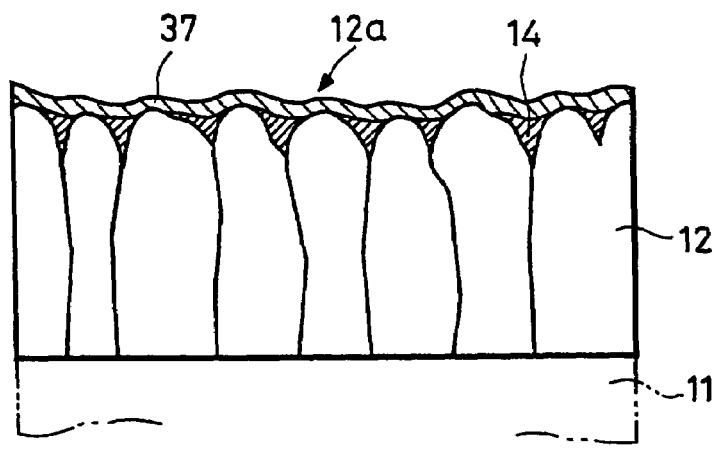
FIGS. 13D to F are manufacturing process charts (2) according to the sixth embodiment of capacitor element of the invention.

In this condition, as shown in FIG. 12C, by using reaction gas, without using etching gas represented by halogen gas, it is designed to sputter and etch physically by $N^+$ ions 36 in the plasma. By this sputtering and etching, reacting with an unbound seed Ti, a reaction layer (TiN layer) 37 is formed as shown in FIG. 13D.

The TiN matter 14 being etched from the bumps forms a part of the lower electrode 12. The reaction layer 37 may be either conductive or insulating, and when the reaction layer 37 is conductive, the reaction layer 37 forms a part of the lower electrode layer, and when the reaction layer 37 is insulating, the reaction layer 37 forms a part of the dielectric film layer. Yet, since only the undulated portion near the surface is etched, the film thickness of the lower electrode 12 is not changed substantially.

Figure 13E:
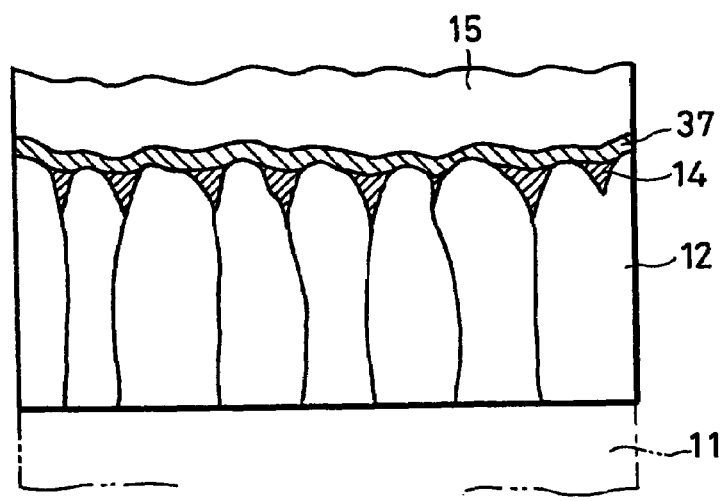

Next, as shown in FIG. 13E, for example, a $Ta_2O_5$ film 15 of 30 nm in thickness is formed on the surface of the reaction layer 37 of the lower electrode 12 as a dielectric film by plasma CVD method same as in the first embodiment. The dielectric film 15 on the lower electrode 12 smoothed by surface treatment by making use of plasma particles in the plasma is deposited uniformly.

Figure 13F:
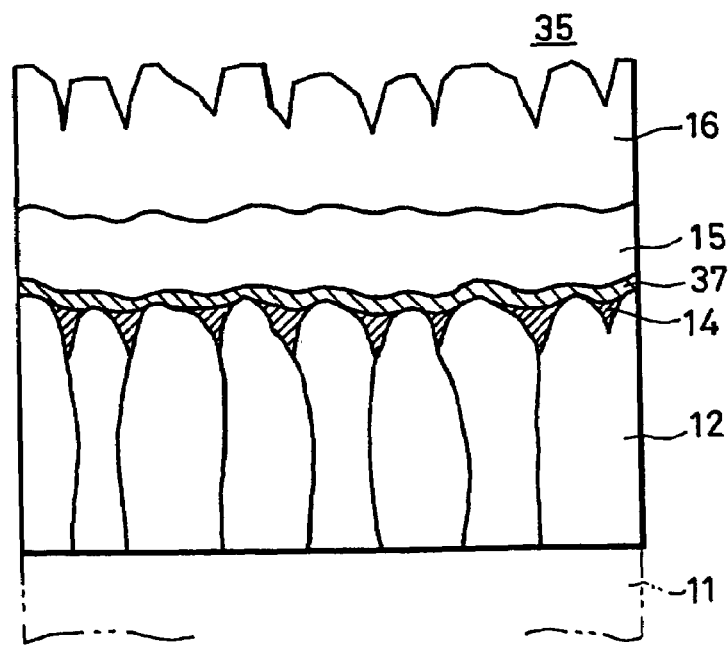

Then, as shown in FIG. 13F, an upper electrode 16 is formed on the dielectric film 15, and an intended capacitor element 35 is obtained.

In this capacitor element 35, too, the dielectric film 15 on the lower electrode 12 is deposited in a uniform thickness, and the leak current is suppressed outstandingly as compared with the conventional capacitor element.

Seventh Embodiment

Figure 14A:
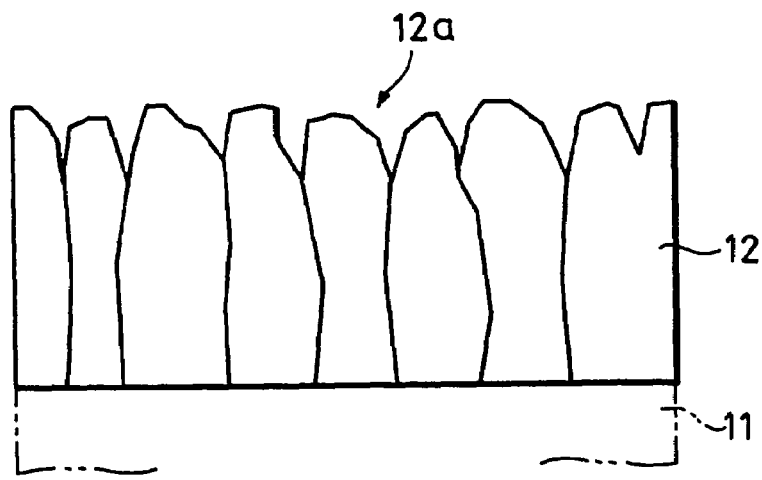
FIGS. 14A to C are manufacturing process charts (1) according to a seventh embodiment of capacitor element of the invention.
Figure 14B:
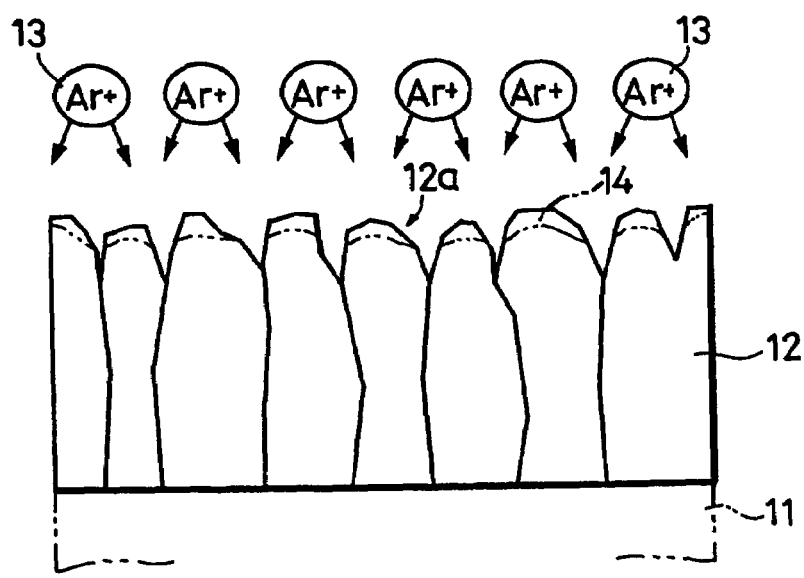
Figure 14C:
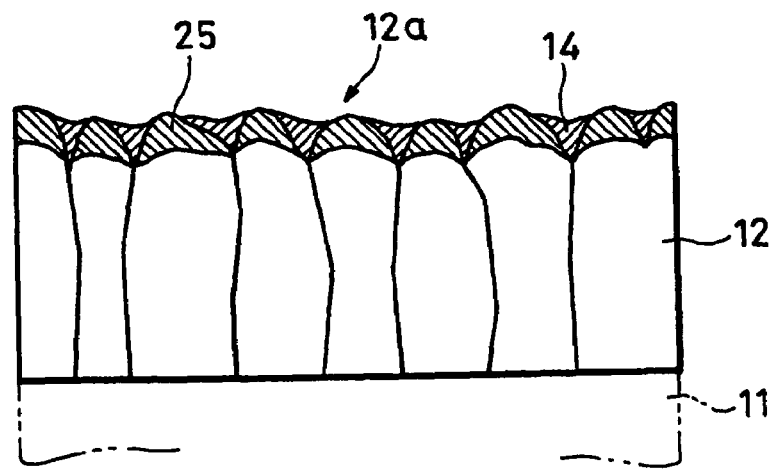

As shown in FIG. 14A to C, same as in the steps of FIG. 8A to C in the fourth embodiment, the surface of the TiN layer 12 having a columnar crystal grain shape of the lower electrode is treated, that is, the recesses in the crystal grain boundary are filled up with TiN matter 14 shaved off from the bumps of the undulated surface by sputtering and etching, and further a part 25 of the surface of the TiN layer 12 is made amorphous, so that the surface of the TiN layer 12 of the lower electrode is flattened.

Figure 15D:
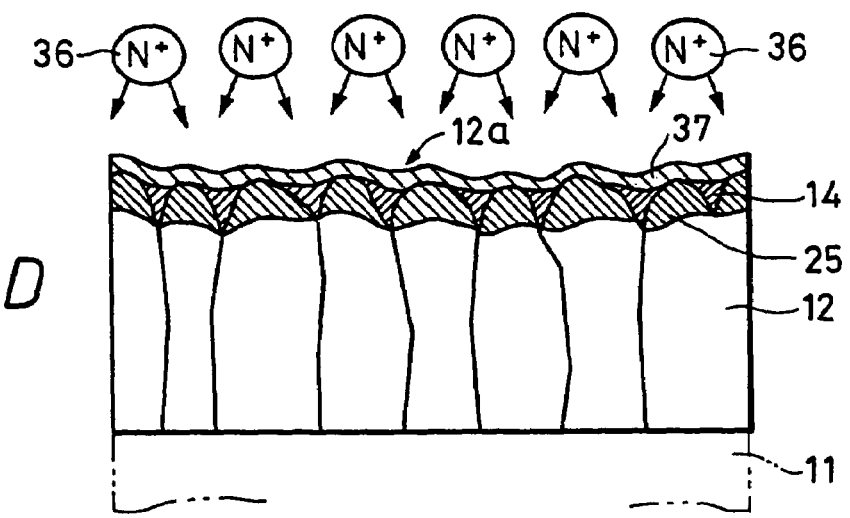
FIGS. 15D to F are manufacturing process charts (2) according to the seventh embodiment of capacitor element of the invention.

Next, as shown in FIG. 15D, in the same condition as in the sixth embodiment, by sputtering and etching by $N^+$ ions 36, and reacting with an unbound seed Ti, a reaction layer (TiN layer) 37 is formed on the flattened surface of the TiN layer 12.

Figure 15E:
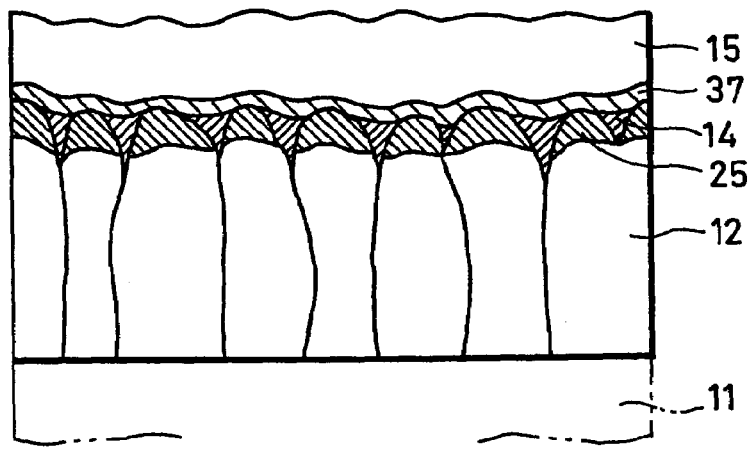

Further, as shown in FIG. 15E, for example, a $Ta_2O_5$ film 15 of 30 nm in thickness is formed on the surface of the reaction layer 37 of the lower electrode 12 as a dielectric film by plasma CVD method same as in the first embodiment. The dielectric film 15 on the lower electrode 12 smoothed by surface treatment by making use of plasma particles in the plasma is deposited uniformly.

Figure 15F:
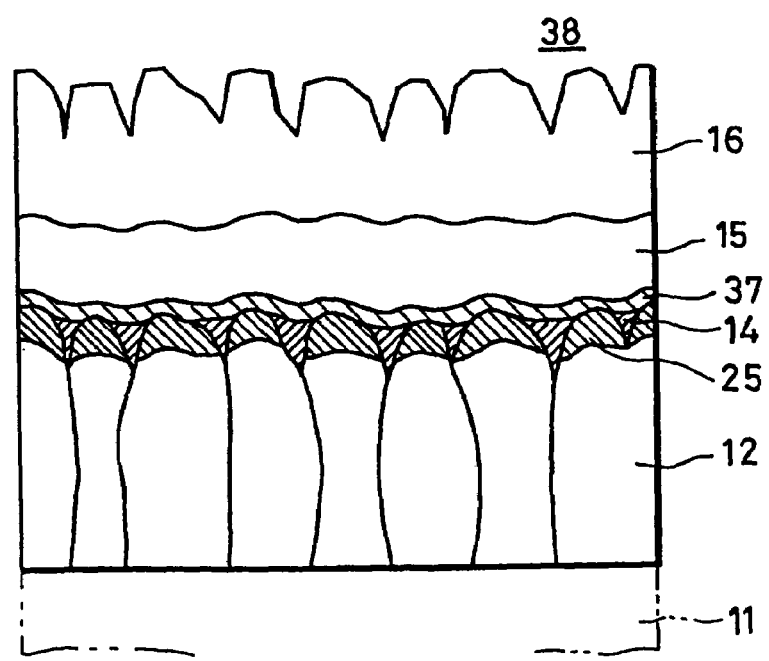

Then, as shown in FIG. 15F, an upper electrode 16 is formed on the dielectric film 15, and an intended capacitor element 38 is obtained.

In this capacitor element 38, too, the dielectric film 15 on the lower electrode 12 is deposited in a uniform thickness, and the leak current is suppressed outstandingly as compared with the conventional capacitor element.

Eighth Embodiment

Figure 16A:
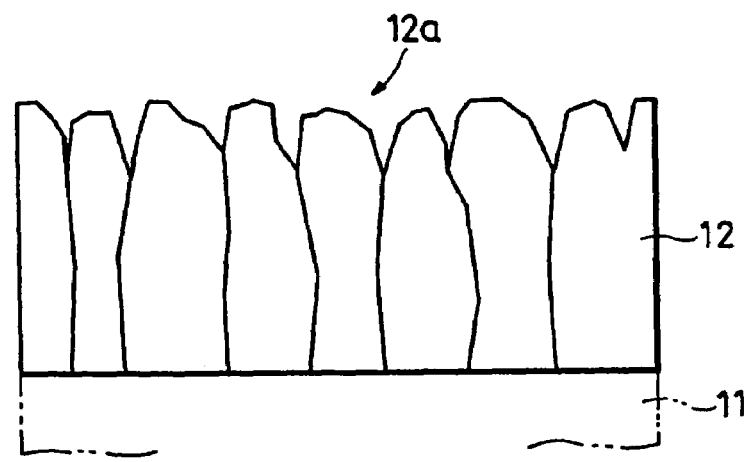
FIGS. 16A to C are manufacturing process charts (1) according to an eighth embodiment of capacitor element of the invention.
Figure 16B:
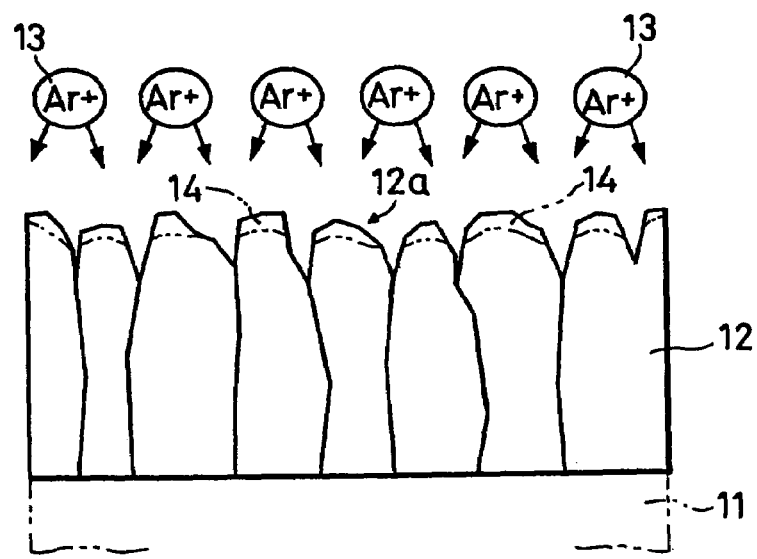
Figure 16C:
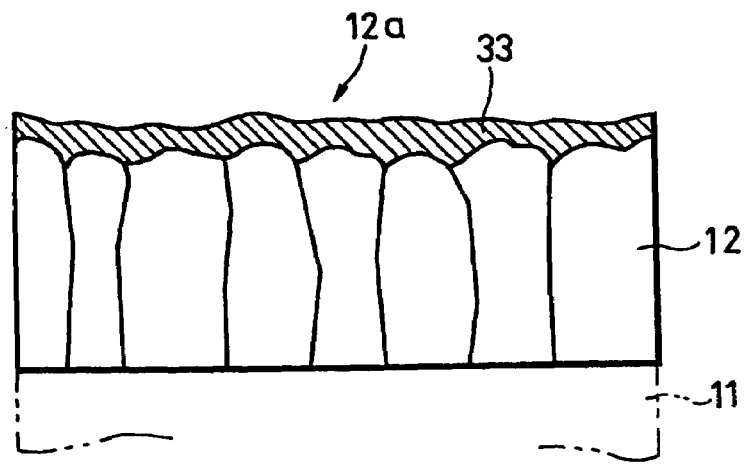

As shown in FIG. 16A to C, same as in the steps of FIG. 10A to C in a fifth embodiment, the surface of the TiN layer 12 having a columnar crystal grain shape of the lower electrode is treated, that is, the recesses in the crystal grain boundary are filled up with TiN matter 14 shaved off from the bumps of the undulated surface by sputtering and etching, and further the entire surface of the TiN layer 12 is made amorphous, so that the surface of the TiN layer 12 of the lower electrode is flattened.

Figure 17D:
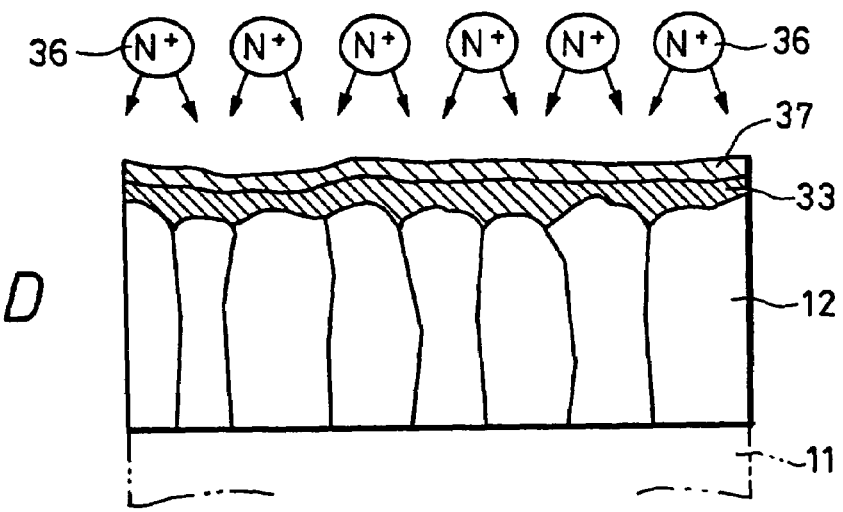
FIGS. 17D to F are manufacturing process charts (2) according to the eighth embodiment of capacitor element of the invention.

Next, as shown in FIG. 17D, in the same condition as in a sixth embodiment, by sputtering and etching by $N^+$ ions 36, and reacting with an unbound seed Ti, a reaction layer (TiN layer) 37 is formed on the flattened surface of the TiN layer 12.

Figure 17E:
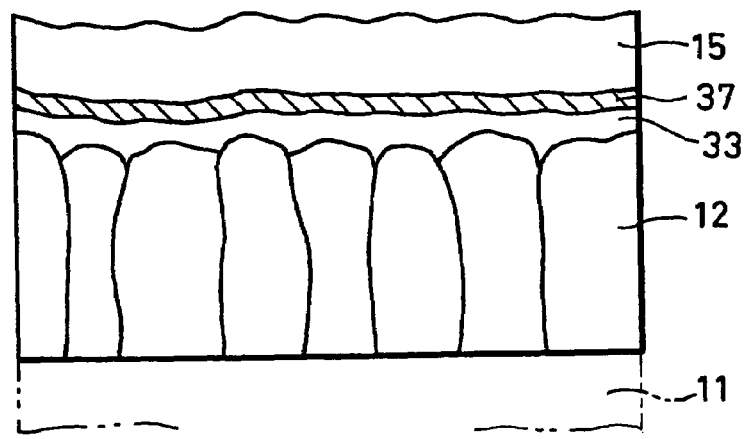

Further, as shown in FIG. 17E, for example, a $Ta_2O_5$ film 15 of 30 nm in thickness is formed on the surface of the reaction layer 37 of the lower electrode 12 as a dielectric film by plasma CVD method same as in the first embodiment. The dielectric film 15 on the lower electrode 12 smoothed by surface treatment by making use of plasma particles in the plasma is deposited uniformly.

Figure 17F:
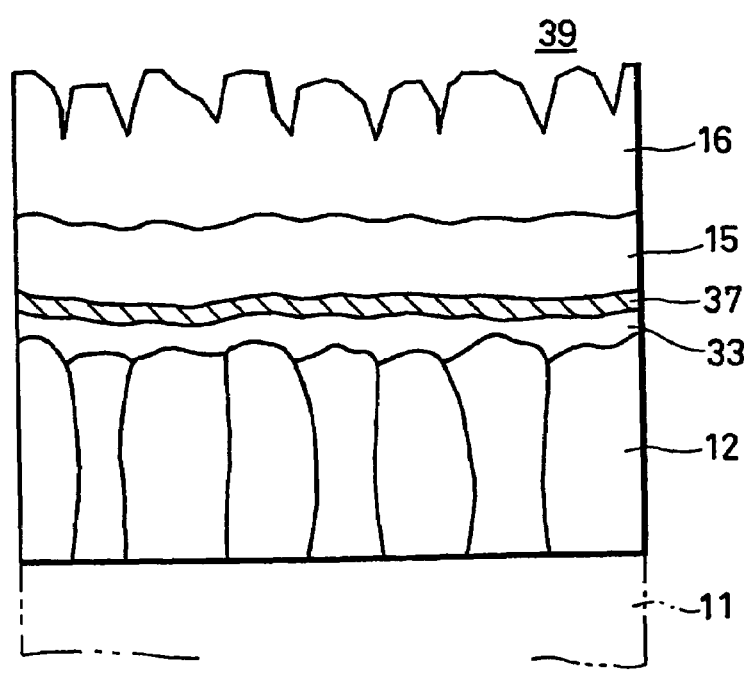

Then, as shown in FIG. 17F, an upper electrode 16 is formed on the dielectric film 15, and an intended capacitor element 39 is obtained.

In this capacitor element 39, too, the dielectric film 15 on the lower electrode 12 is deposited in a uniform thickness, and the leak current is suppressed outstandingly as compared with the conventional capacitor element.

In the foregoing embodiments, at the time of surface treatment of the surface of the TiN layer 12, a rare gas, that is, Ar gas is supplied, and the surface is treated by sputtering and etching by the $Ar^+$ ions in the plasma, but the plasma may be formed easily by using a mixture gas of Ar gas and inert gas, such as $N_2$ gas.

When the TiN layer is used as the lower electrode 12, processing is easy. When the internal wiring in the semiconductor device is composed of a laminated wiring having Al wiring, barrier metal layers of TiN and others can be laminated. When the TiN layer is used in the lower electrode for composing the capacitor element of the invention, this lower electrode and the laminated wiring can be formed in a same sputtering apparatus, and can be later formed simultaneously by patterning easily and stably (without re-adhesion) by a reactive dry etching apparatus.

Figure 25:
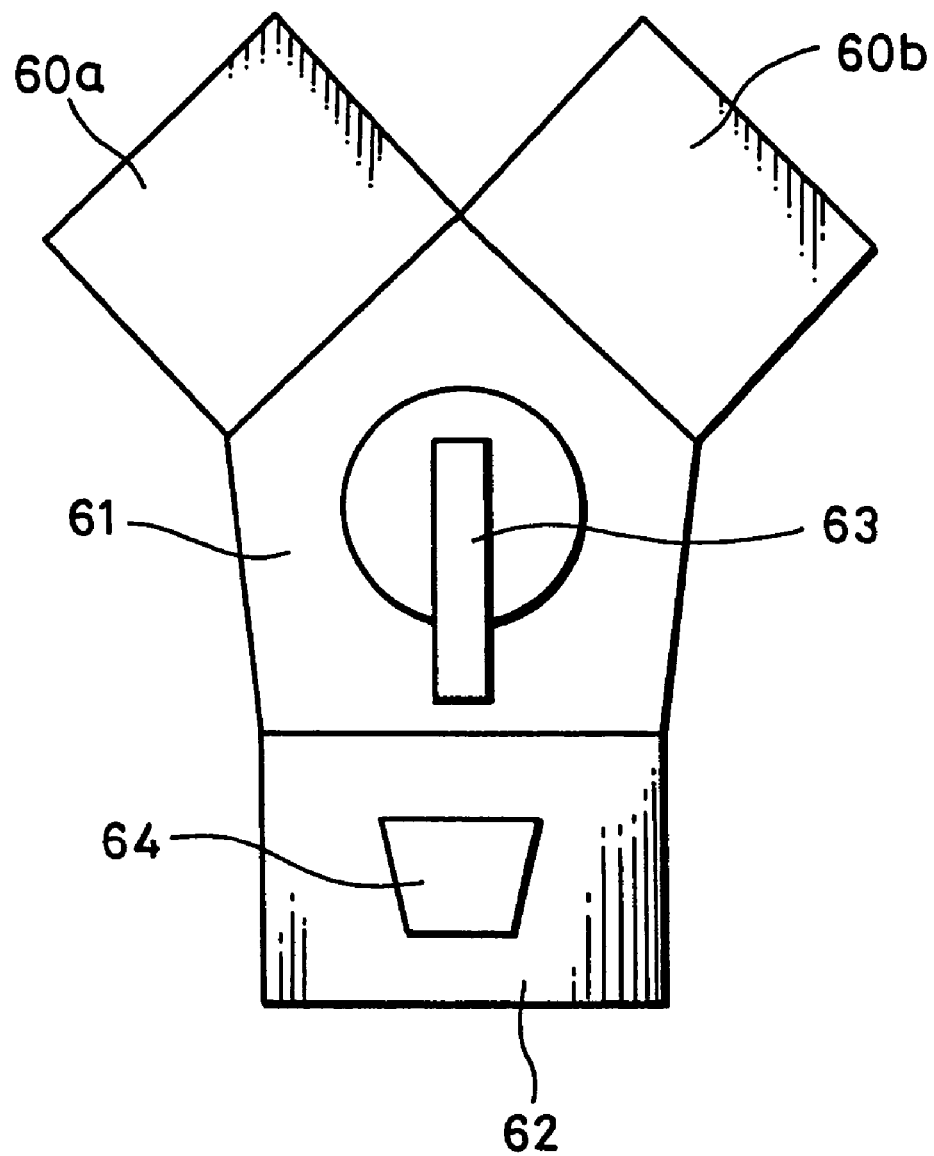
FIG. 25 is a schematic diagram showing a multi-chamber type processing apparatus used in manufacture of capacitor element of the invention.

In the embodiment 1 to the embodiment 5, the flattening process of the lower electrode and film forming process of the dielectric film can be done continuously while maintaining the reduced pressure state without being exposed to the atmosphere (that is, without breaking the vacuum state). More specifically, a treating apparatus of multi-chamber system shown in FIG. 25 is used. Treating chambers 60*a*, 60*b* are connected to a cassette station 62 which is always at the atmospheric pressure by way of a vacuum preparation chamber 61. The treating chamber 60*a* corresponds, for example, to the reaction chamber 42 shown in FIG. 18.

The wafer in the cassette 64 disposed in the cassette station 62 taken out by a conveying robot 63 and put into the vacuum preparation chamber 61 at atmospheric pressure, and after the vacuum preparation chamber 61 is evacuated, the wafer is carried by the conveying robot 63 and delivered into the treating chamber 60*a* at reduced pressure. In this treating chamber 60*a*, the lower electrode is flattened as described in the embodiments. After this process, the wafer is once discharged into the vacuum preparation chamber 61 at reduced pressure, and sent into the treating chamber 60*b* at reduced pressure. In this treating chamber 60*b*, a dielectric film is formed on the flattened lower electrode, for example, by plasma CVD. Thus, the wafer is not exposed to the atmosphere after the flattening process of the lower electrode, and the dielectric film is formed directly at reduced pressure, and growth of spontaneous oxide film on the lower electrode surface can be suppressed, and uniformity of film thickness of the dielectric layer and improvement of film quality can be realized.

Moreover, in the embodiment 6 to the embodiment 8, the flattening process of the lower electrode, forming process of reaction layer, and film forming process of the dielectric film can be done continuously while maintaining the reduced pressure state without being exposed to the atmosphere. In this case, too, growth of spontaneous oxide film on the lower electrode or reaction layer surface can be suppressed, and uniformity of film thickness of the dielectric layer and improvement of film quality can be realized. In the forming process of the upper electrode, too, if operated continuously at reduced pressure without exposing to the atmosphere after forming the dielectric film, growth of spontaneous oxide film on the lower electrode or reaction layer surface can be suppressed, and uniformity of film thickness of the upper electrode and improvement of film quality can be realized.

Not limited to the treating apparatus of multi-chamber system, the same process can be done continuously in one treating chamber without breaking the vacuum state. Or by using a treating apparatus of continuous chamber system, different processes can be done continuously while moving the wafer under reduced pressure.

The invention claimed is:

1. A capacitor element comprising a lower electrode, a dielectric film, and an upper electrode, wherein the lower electrode has a multi-layered laminated structure, part of at least one of said layers is formed of a metal compound, each of at least two of said layers includes a plurality of crystal grains distributed contiguously across the capacitor forming recesses on respective surfaces of said layers between each adjacent crystal grain, and each surface is substantially flattened by material removed from said surface filling substantially all of each recess.

2. The capacitor element according to claim 1, wherein each crystal grain has a columnar shape.

3. The capacitor element according to claim 1, wherein said layer is shaped as a stone hedge.

* * * * *